United States Patent
Uno et al.

(10) Patent No.: US 6,406,196 B1
(45) Date of Patent: *Jun. 18, 2002

(54) OPTICAL DEVICE AND METHOD FOR PRODUCING THE SAME

(75) Inventors: Tomoaki Uno, Kobe; Jun Ohya, Osaka; Genji Tohmon, Mino; Masahiro Mitsuda, Kyoto, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/809,976
(22) PCT Filed: Aug. 1, 1996
(86) PCT No.: PCT/JP96/02164
 § 371 (c)(1),
 (2), (4) Date: Jul. 24, 1997
(87) PCT Pub. No.: WO97/06458
 PCT Pub. Date: Feb. 20, 1997

(30) Foreign Application Priority Data

Aug. 3, 1995 (JP) ............................................. 7-198538

(51) Int. Cl.[7] .................................................. G02B 6/36
(52) U.S. Cl. ............................... 385/89; 385/88; 385/47
(58) Field of Search ......................... 385/4, 31, 47–49, 385/88, 89

(56) References Cited

U.S. PATENT DOCUMENTS

| | | | |
|---|---|---|---|
| 4,165,496 A | * 8/1979 | Di Domenico, Jr. et al. | 385/48 |
| 4,549,782 A | 10/1985 | Miller | 385/48 |
| 4,693,544 A | * 9/1987 | Yamasaki et al. | 385/47 |
| 4,756,590 A | * 7/1988 | Forrest et al. | 385/89 |
| 5,071,213 A | * 12/1991 | Chan | 385/52 |
| 5,119,448 A | * 6/1992 | Schaefer et al. | 385/4 |
| 5,497,438 A | * 3/1996 | Ishikawa et al. | 385/38 |
| 5,499,309 A | 3/1996 | Kozuka et al. | 385/38 |
| 5,537,500 A | * 7/1996 | Yokoyama | 385/47 |
| 5,600,741 A | * 2/1997 | Hauer et al. | 385/47 |
| 5,644,124 A | * 7/1997 | Hamada et al. | 250/216 |
| 5,687,270 A | * 11/1997 | Takizawa | 385/94 |

FOREIGN PATENT DOCUMENTS

| | | | | |
|---|---|---|---|---|
| DE | 2851654 | * | 6/1980 | 385/47 |
| EP | 0 646 812 | | 4/1995 | |
| EP | 0 661 566 A1 | | 7/1995 | |
| JP | 55-88011 | | 7/1980 | |
| JP | 0214127 | * | 12/1983 | 385/47 |
| JP | 59-185306 | | 10/1984 | |
| JP | 60-501524 | | 9/1985 | |

(List continued on next page.)

OTHER PUBLICATIONS

Japanese Search Report dated May 27, 1997.
Ikushima, Ichiro; "High–Performance Compact Optical WDM Transceiver Module for Passive Double Star Subscriber Systems", Journal of Lightwave Technology, vol. 13, No. 3, 3/95, pp. 517–524.

(List continued on next page.)

Primary Examiner—Rodney Bovernick
Assistant Examiner—Juliana K. Kang
(74) Attorney, Agent, or Firm—Ratner & Prestia

(57) ABSTRACT

The optical device of the present invention includes a substrate, at least one first groove formed on the substrate, an optical fiber placed in the first groove, and at least one second groove diagonally formed across the optical fiber. Furthermore, the optical device includes an optical member inserted in the second groove, having a surface which reflects or diffracts at least a part of light propagating through the optical fiber. A photodetector is placed at a position where light which is reflected or diffracted by the optical member is received. As a result, an miniaturized optical device having a low loss and high reliability can be provided at low cost.

12 Claims, 31 Drawing Sheets

FOREIGN PATENT DOCUMENTS

| | | |
|---|---|---|
| JP | 61-32804 | 2/1986 |
| JP | 61-176903 | 8/1986 |
| JP | 61-208283 | 9/1986 |
| JP | 62-95504 | 5/1987 |
| JP | 62-121407 | 6/1987 |
| JP | 62-186207 | 8/1987 |
| JP | 62-234390 | 10/1987 |
| JP | 63-33707 | 2/1988 |
| JP | 63-66514 | 3/1988 |
| JP | 63-82957 | 5/1988 |
| JP | 63-140589 | 6/1988 |
| JP | 63-161413 | 7/1988 |
| JP | 63-205611 | 8/1988 |
| JP | 63-226978 | 9/1988 |
| JP | 63-228113 | 9/1988 |
| JP | 0304208 * | 12/1988 ................... 385/47 |
| JP | 0307407 * | 12/1988 ................... 385/47 |
| JP | 63-188608 | 12/1988 |
| JP | 2-15203 | 1/1990 |
| JP | 3-130705 | 6/1991 |
| JP | 3-158805 | 7/1991 |
| JP | 3-189607 | 8/1991 |
| JP | 4-3002 | 1/1992 |
| JP | 4-51002 | 2/1992 |
| JP | 4-101106 | 4/1992 |
| JP | 4-264409 | 9/1992 |
| JP | 5-12706 | 1/1993 |
| JP | 5-34650 | 2/1993 |
| JP | 6-3539 | 1/1994 |
| JP | 6-102429 | 4/1994 |
| JP | 6-331837 | 12/1994 |
| JP | 7-22630 | 1/1995 |

OTHER PUBLICATIONS

European Search Report dated Nov. 27, 1998 for corresponding European Patent Application No. 96925964.7.

A. Reichelt et al., "Wavelength–Division Multi Demultiplexers for Two–Channel Single–Mode Transmission Systems", Journal of Lightwave Technology, vol. LT–2, No. 5, Oct., 1984, Title page and pp. 676–681.

T. Oguchi et al., "Arrayed hybrid filter/coupler device for inservice fibre line testing", Electronics Letters, No. 20, Sep. 30, 1993, pp. 1786–1787.

Tomoaki Uno et al., "Novel 1.3/1.55μm dual–wavelength receiver having embedded fiber circuit for optical subscriber systems", $19^{th}$ Optical Fiber Communication Conference, pp. 54–55, 1996.

* cited by examiner

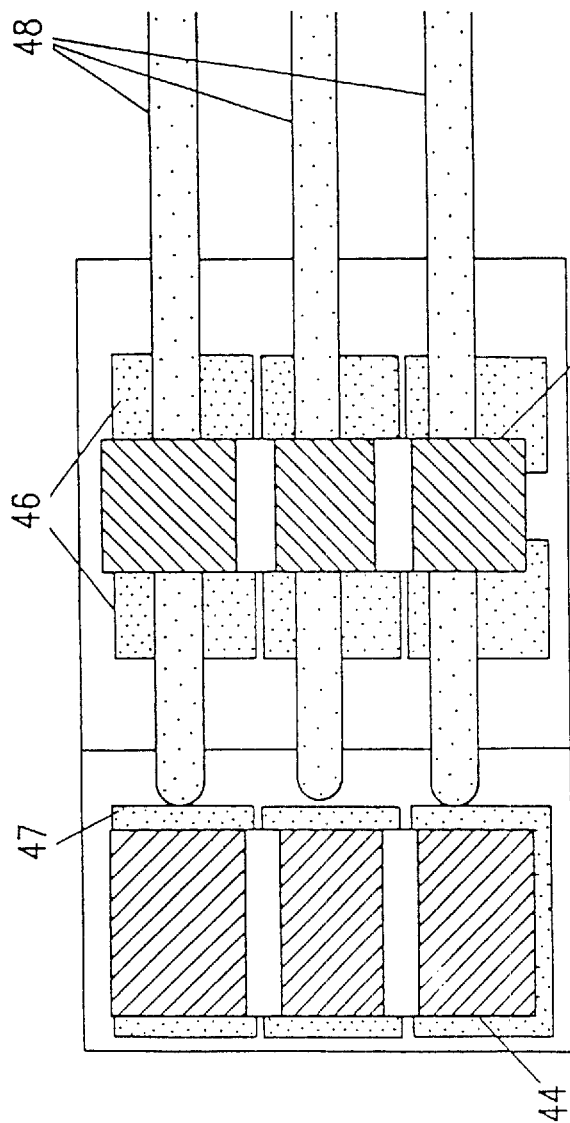
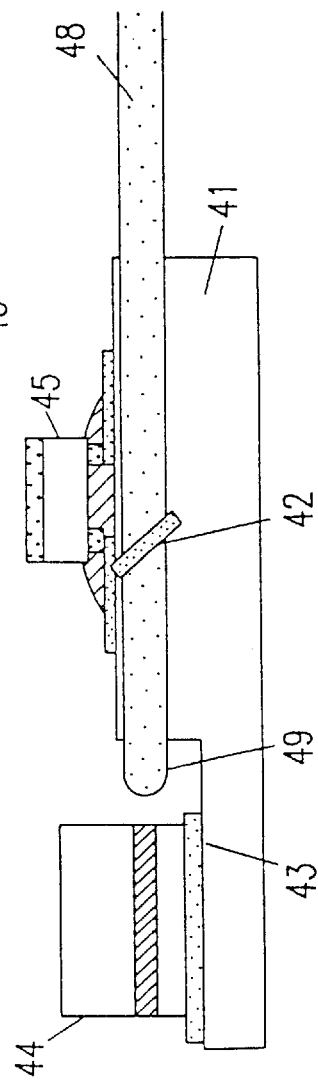
FIG.9A
FIG.9B

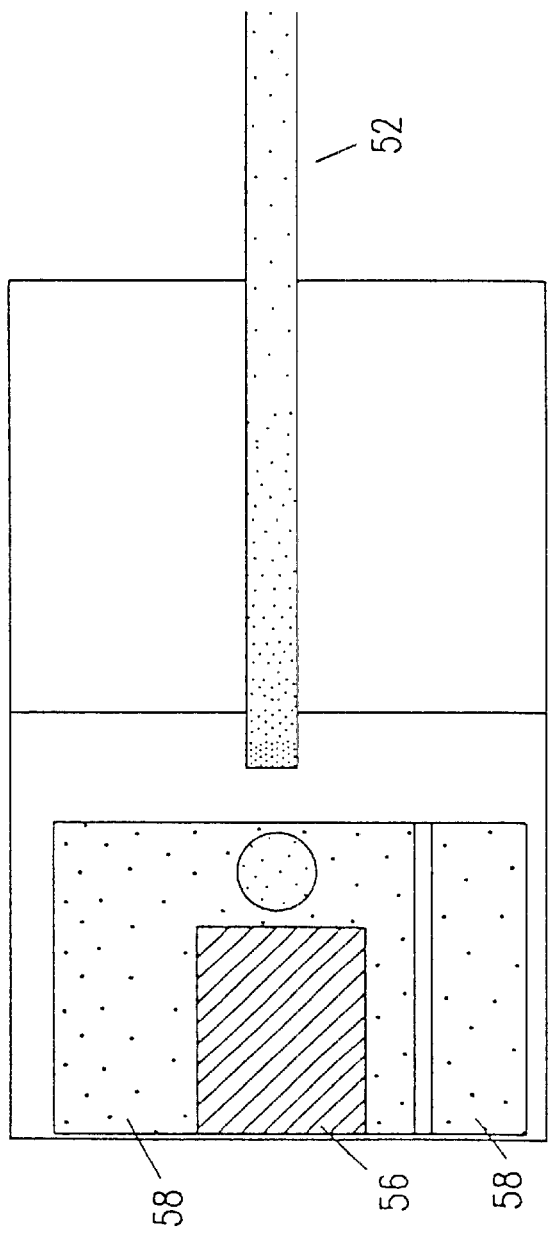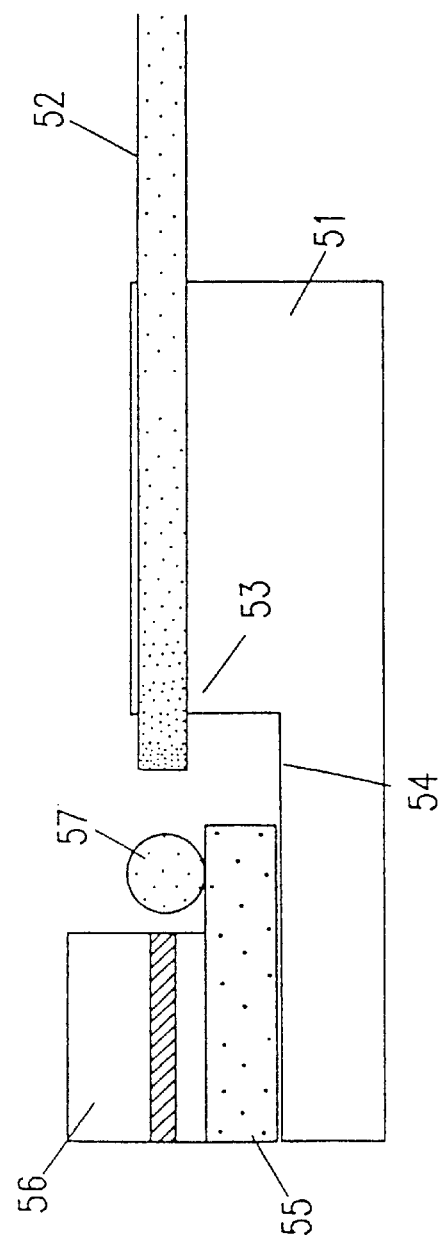
FIG.10A
FIG.10B

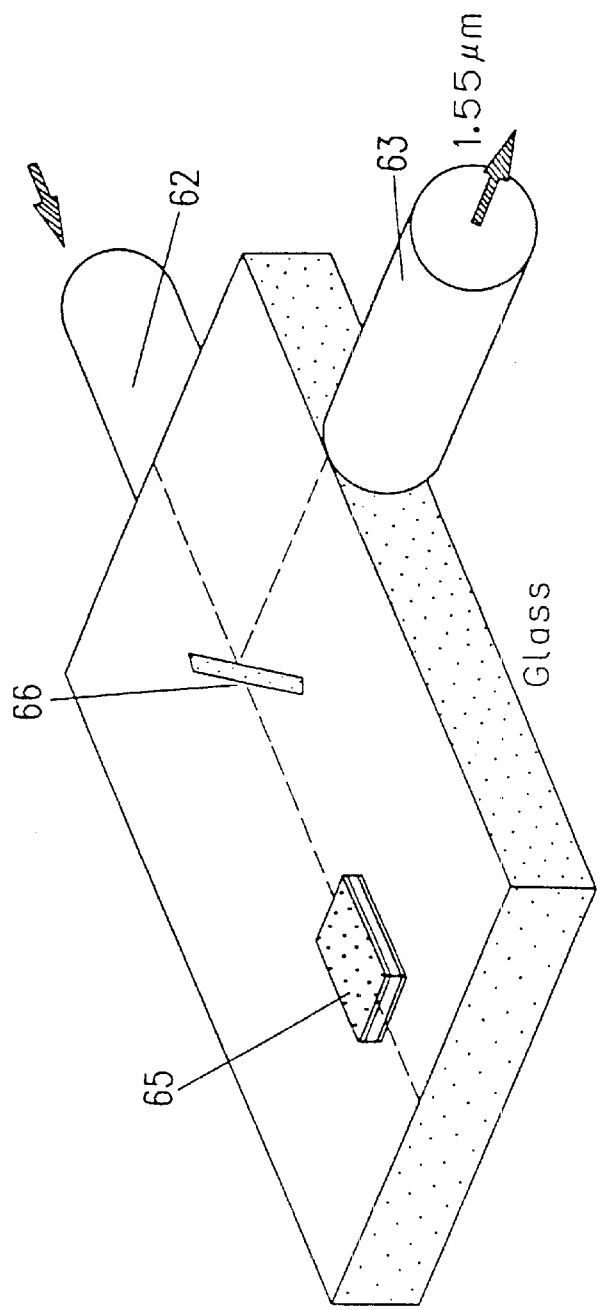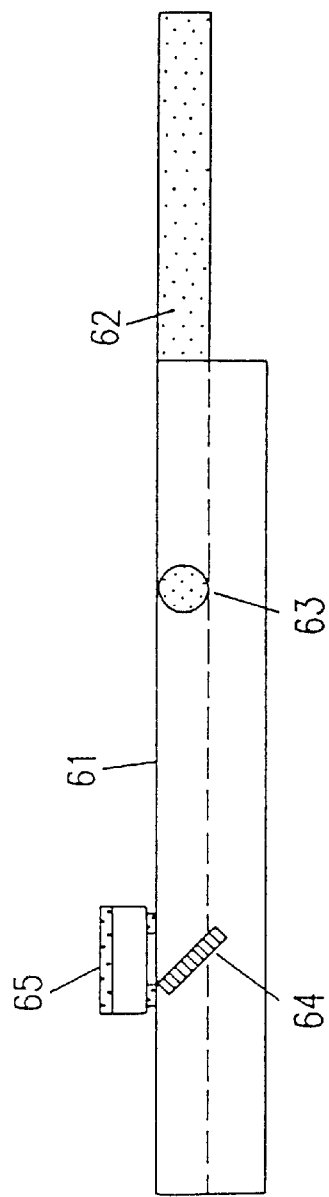
FIG.11A
FIG.11B

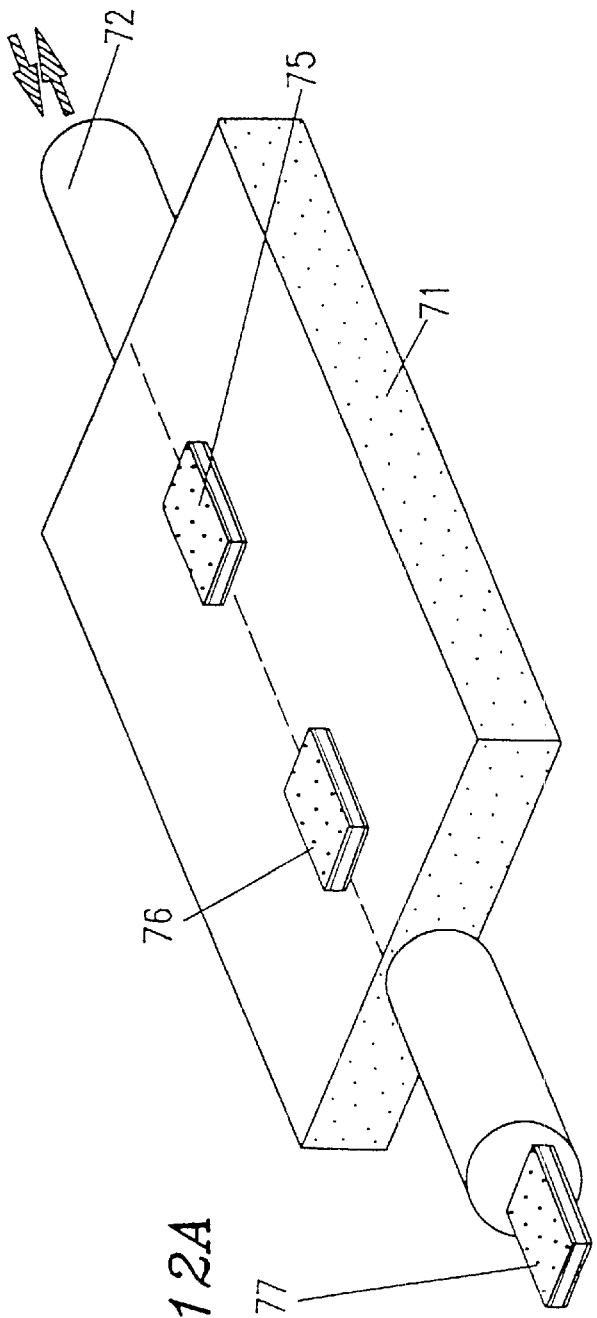
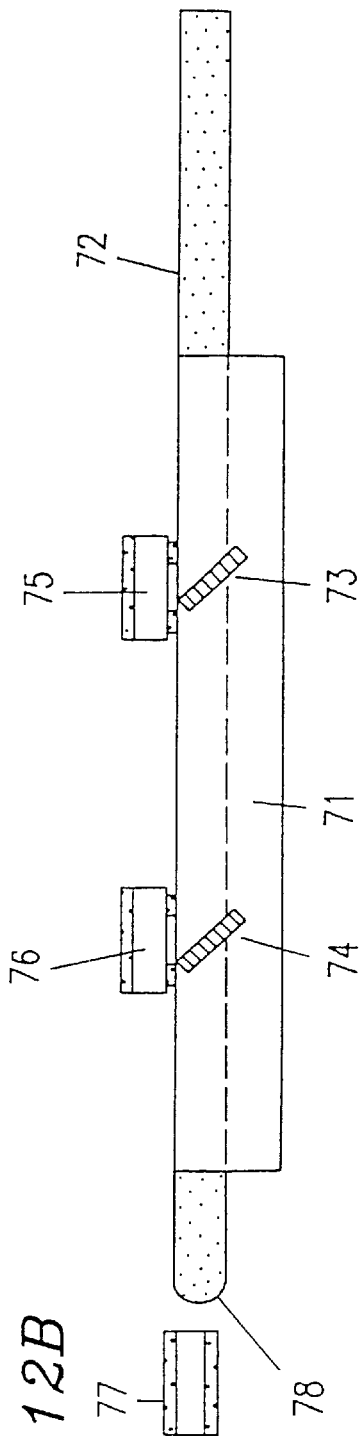
FIG. 12A
FIG. 12B

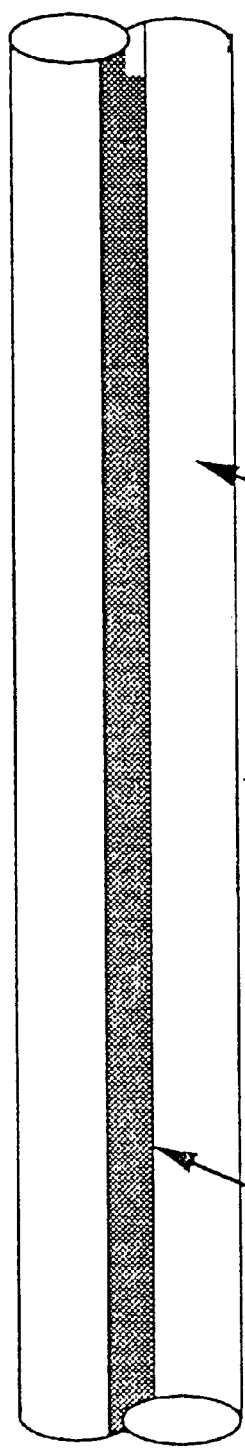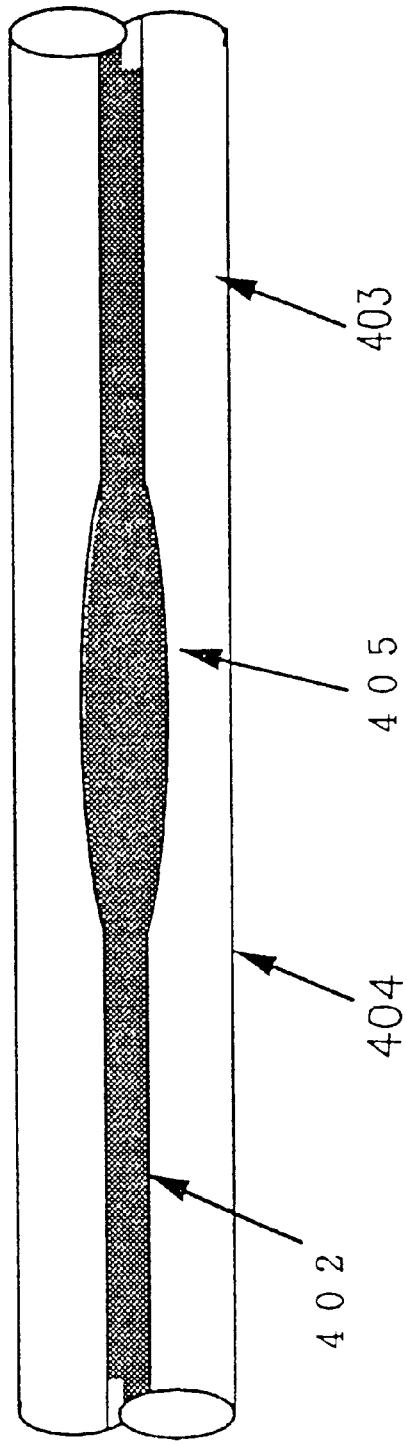
FIG.18A
FIG.18B

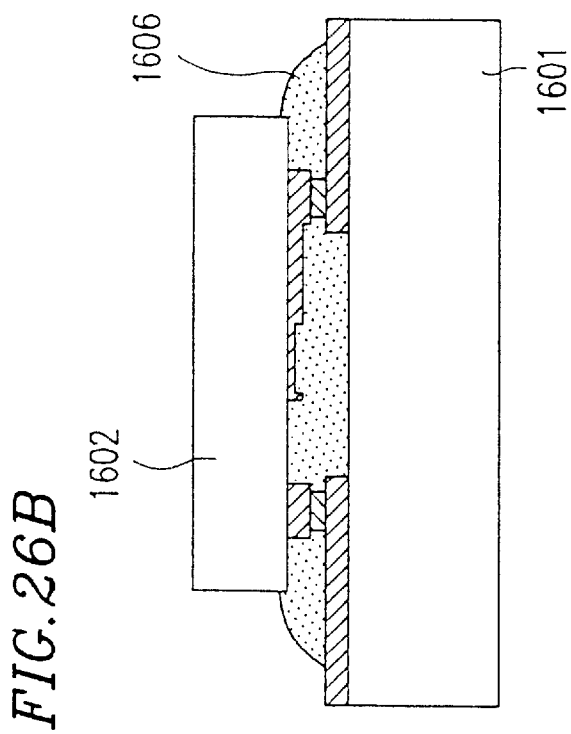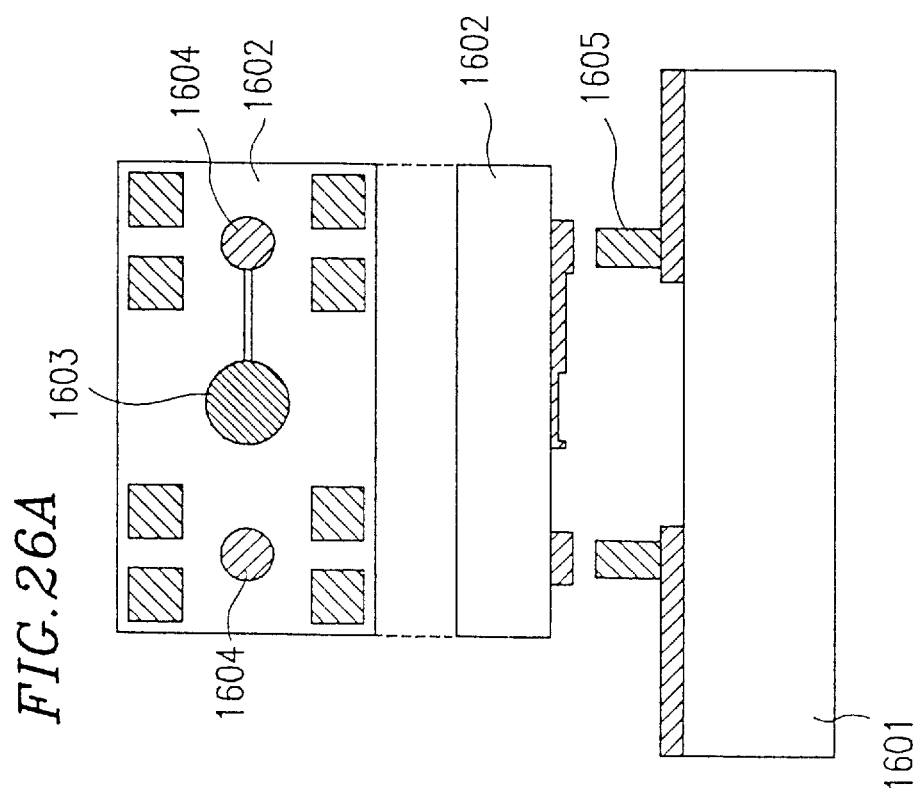

OPTICAL DEVICE AND METHOD FOR PRODUCING THE SAME

TECHNICAL FIELD

The present invention relates to an optical device connected to an optical fiber transmission line, capable of receiving or transmitting/receiving a light signal, and a method for producing the same.

BACKGROUND ART

Wavelength division multiplexing (WDM) enables a transmission capacity of an optical transmission system to be increased. It also realizes bidirectional transmission and simultaneous transmission of different kinds of signals. Thus, the WDM is capable of flexibly meeting service requirements in an optical transmission system, and is applicable to various optical transmission systems such as a relay-transmission system, a subscriber system, and a local area transmission system.

In recent years, in particular, optical subscriber systems which transmit multi-channel video information and data from a central station to households through optical fibers have been proposed and studied. These systems require a plurality of photodetectors for simultaneously receiving different kinds of light signals which are multiplexed in wavelength at subscribers' household terminals and light-emitting devices for sending requests and data from households to the central station. For example, a device used for this purpose is disclosed in a reference (I. Ikushima et al., "High-performance compact optical WDM transceiver module for passive double star subscriber systems", Journal of Lightwave Technology, vol. 13, No. Mar. 3, 1995).

FIG. 30 shows a conventional example of a light-receiving optical device which is applicable to bidirectional signal transmission. This device is disclosed in Japanese Laid-Open Patent Publication No. 6-331837.

As shown in FIG. 30, in this device, a first optical fiber 2012 and a second optical fiber 2014 are coupled in series with a gap (about several $\mu$m) therebetween. One end of the first optical fiber 2012 is cut obliquely with respect to an optical axis and provided with a semi-transparent and semi-reflective surface 2011 which reflects a part of a light signal and passes the remaining part. Similarly, one end of the second optical fiber 2014 is cut obliquely with respect to an optical axis and provided with a semi-transparent and semi-reflective surface 2013 which reflects a part of a light signal and passes the remaining part.

The first and second optical fibers 2012 and 2014 are arranged in such a manner that the semi-transparent and semi-reflective surface 2013 of the second optical fiber faces the semi-transparent and semi-reflective surface 2011 of the first optical fiber 2012 and the respective optical axes are linearly aligned.

A light signal propagating from the right side of the drawing is reflected by the semi-transparent and semi-reflective surface 2011 of the first optical fiber 2012 and output from the optical fiber 2012. A first photodiode 2015 is placed along a path of the light signal and receives the light signal to generate an electric signal.

A light signal propagating from the left side of the drawing is reflected by the semi-transparent and semi-reflective surface 2013 of the second optical fiber 2014 and output from the optical fiber 2014. A second photodiode 2016 is placed along a path of the light signal and receives the light signal to generate an electric signal.

In the conventional optical device, a semi-transparent and semi-reflective surface is directly formed on the diagonally-cut facet of each optical fiber. Because of this, (1) a special cutting is required to be conducted with respect to the facet of an optical fiber so as to make it smooth or grinding the facet of an optical fiber after diagonally cutting it is required. Furthermore, (2) in order to form a semi-transparent and semi-reflective surface on the facet of an optical fiber, it is required to form a thin film on the facet of the optical fiber. The step of inserting an optical fiber into a thin film deposition apparatus such as a vacuum deposition apparatus and depositing a thin film on the facet of the optical fiber decreases production through-put.

In addition, the ends of two different optical fibers are separately cut diagonally with respect to optical axes, and then, arranged in such a manner that the respective optical axes are aligned. Therefore, (3) it is required to adjust the optical axes with high precision; and (4) the light propagation loss between two optical fibers is likely to increase due to the shift of the optical axes and the transmission loss is varied depending upon devices. Furthermore, (5) there is a difference in refractive index between the optical fibers and the air under the condition that the optical axes of two optical fibers are aligned, even with an optical fiber gap of about several $\mu$m. Therefore, signal light is refracted in the gap, and the transmission loss is likely to greatly increase.

The present invention has been achieved in view of the above-mentioned problems, and its objective is to provide a compact, integrated, and light-weight optical device with improved productivity at low cost.

Another objective of the present invention is to provide a bidirectional optical device connected to an optical fiber transmission line, receiving and transmitting a light signal, and a method for producing the same.

DISCLOSURE OF THE INVENTION

An optical device of the present invention includes: a substrate; at least one first groove formed on the substrate; an optical fiber provided in the first groove; and at least one second groove diagonally traversing the optical fiber. The device further includes an optical member which is inserted in the second groove and has a surface reflecting or diffracting at least a part of light propagating through the optical fiber.

In a preferred embodiment, a material having a refractive index $n_r$ which is almost equal to a refractive index $n_f$ of a core portion of the optical fiber is embedded at least between the optical member and the optical fiber in the second groove.

In a preferred embodiment, there is a relationship: $0.9 \leq (n_r/n_f) \leq 1.1$ between the refractive index $n_r$ and the refractive index $n_f$.

In a preferred embodiment, the material having the refractive index $n_r$ is made of resin.

In a preferred embodiment, the material having the refractive index $n_r$ is made of UV-curable resin.

In an embodiment, minute unevenness is present on an inner wall of the second groove.

In an embodiment, the optical member selectively reflects light having a wavelength in a selected range.

In an embodiment, the optical member selectively passes light having a wavelength in a selected range.

In a preferred embodiment, the optical member includes a base made of a material having a refractive index $n_b$ and a dielectric multi-layer film formed on the base, and there is a relationship: $0.9 \leq (n_b/n_f) \leq 1.1$ between the refractive index $n_b$ and the refractive index $n_f$.

In an embodiment, the surface of the optical member has a diffraction grating.

In an embodiment, the substrate is made of a material which is transparent to signal light propagating through the optical fiber.

In an embodiment, the substrate is made of glass.

In an embodiment, the substrate is made of ceramic.

In an embodiment, the substrate is made of a semiconductor.

In a preferred embodiment, a normal to the surface of the optical member is not parallel to an optical axis of the optical fiber.

In a preferred embodiment, the second groove is tilted with respect to an upper surface of the substrate.

In an embodiment, at least one optical element which receives light reflected or diffracted by the optical member is provided on the substrate.

In an embodiment, at least one second optical element which receives light passed through the optical member is further provided on the substrate.

In an embodiment, the substrate has an upper surface and a bottom surface, and the device further includes: a first photodetector which is provided on the bottom surface of the substrate and receives light reflected or diffracted by the optical member; and a second photodetector which is provided on the upper surface of the substrate and receives light reflected or diffracted by the optical member.

In an embodiment, the substrate has an upper surface and a bottom surface on which a reflector is attached, and the device further includes: a first photodetector which is provided on the upper surface of the substrate and receives light reflected or diffracted by the optical member; and a second photodetector which is provided on the upper surface of the substrate and receives light reflected or diffracted by the optical member via the reflector.

The above-mentioned substrate has an upper surface, a bottom surface, and a plurality of side surfaces, and the device further includes: a first photodetector which is provided on one of the plurality of side surfaces of the substrate and receives light reflected or diffracted by the optical member; and a second photodetector which is provided on another side surface of the plurality of side surfaces of the substrate and receives light reflected or diffracted by the optical member.

In an embodiment, the optical element is a photodetector which generates an electric signal in accordance with received light.

In a preferred embodiment, the photodetector is fixed onto the substrate.

In a preferred embodiment, a material having a refractive index $n_p$ which is almost equal to a refractive index $n_f$ of a core portion of the optical fiber is embedded between a light-receiving surface of the photodetector and the substrate.

In an embodiment, a low reflectance film is formed on the light-receiving surface of the photodetector.

In an embodiment, the number of the second groove is plural, and optical members having different filter characteristics are inserted in the plurality of second grooves, respectively.

In an embodiment, the number of the first groove is plural, the number of the second groove is singular, and the single second groove traverses the plurality of first grooves.

In an embodiment, the number of the first groove is plural, and the plurality of first grooves are arranged on the substrate almost in parallel with each other.

In an embodiment, a third groove is formed on the substrate in a direction crossing the first groove, another optical fiber is provided in the third groove, and light reflected or diffracted by the optical member is coupled to the another optical fiber.

In an embodiment, laser light emitted by a semiconductor laser is coupled to an end portion of the optical fiber.

In an embodiment, the substrate has a concave portion on the upper surface, a semiconductor laser is provided on the concave portion of the substrate, the end portion of the optical fiber is formed in a lens shape, and light emitted by the semiconductor laser is optically coupled to the optical fiber.

In an embodiment, the end portion of the optical fiber has a movable portion capable of moving a position of the lens-shaped portion relative to the semiconductor laser device, and the movable portion is fixed in such a manner that light emitted by the semiconductor laser is optically coupled to the optical fiber.

In an embodiment, the substrate has a concave portion on the upper surface, and the device includes a semiconductor laser provided on the concave portion of the substrate and a lens which optically couples light emitted by the semiconductor laser to the optical fiber.

In an embodiment, a support member supporting the semiconductor laser and the lens is provided on the concave portion of the substrate.

In a preferred embodiment, the semiconductor laser provided on the support member is provided on the concave portion of the substrate after being selected by a test.

In an embodiment, a photodetector which receives a part of laser light from the semiconductor laser is provided on the substrate.

In an embodiment, the optical fiber has a first portion which functions as a single mode fiber in a wavelength band of signal light propagating through the optical fiber, a second portion which functions as a multi-mode fiber in the wavelength band of the signal light, and a connecting portion connecting the first portion to the second portion, and a core diameter of the connecting portion gradually and continuously changes from the first portion to the second portion.

In an embodiment, a core diameter of the second portion which functions as the multi-mode fiber of the optical fiber is increased by heat-treating a part of a single mode fiber.

In an embodiment, the another optical fiber in the third groove is made of a multi-mode fiber, and a photodetector which receives light reflected or diffracted by the optical member through the another optical fiber is further provided.

In an embodiment, an electric wiring pattern is formed on the substrate, and the photodetector is connected to the electric wiring pattern.

In an embodiment, a semiconductor electric element which conducts a signal processing of the photodetector is connected to the electric wiring pattern.

In an embodiment, one end of the optical fiber is provided with an optical connector so as to be connected to another optical fiber.

In an embodiment, a protecting film formed so as to cover an upper surface of the substrate is further provided.

In an embodiment, the substrate is accommodated in a housing having an output port of the optical fiber and a plurality of terminals electrically connected to outside.

In an embodiment, the semiconductor laser is connected to the support member with a first solder material, and the support member is connected to the substrate with a second solder material having a melting point higher than a melting point of the first solder material.

In an embodiment, the substrate is accommodated in a housing having an output port of the optical fiber and a plurality of terminals electrically connected to outside, and the substrate is connected to a bottom portion of the housing with a third solder material having a melting point lower than a melting point of the second solder material.

Another optical device of the present invention includes: a substrate, at least one first groove formed on the substrate; an optical fiber provided in the first groove, which allows signal light to propagate bidirectionally; and at least one second groove diagonally traversing the optical fiber. The device further includes: an optical member inserted in the second groove, having a surface which reflects or diffracts at least a part of the bidirectional signal light propagating through the optical fiber; and two photodetectors respectively receiving light reflected or diffracted by the optical member of the bidirectional signal light.

In an embodiment, the above-mentioned device further includes a third groove which traverses the optical fiber and a second optical member inserted in the third groove, having a surface which reflects and removes light containing an unnecessary wavelength component propagating through the optical fiber.

In an embodiment, the second groove is perpendicular to an optical axis of the optical fiber.

In an embodiment, the second groove and the third groove are formed at different angles with respect to an optical axis of the optical fiber so that light reflected by the second optical member inserted in the third groove is not mixed in the two photodetectors.

In a preferred embodiment, a material having a refractive index $n_r$ which is almost equal to a refractive index $n_f$ of a core portion of the optical fiber is embedded at least between the optical member and the optical fiber in the second groove.

In a preferred embodiment, there is a relationship: $0.9 \leq (n_r/n_f) \leq 1.1$ between the refractive index $n_r$ and the refractive index $n_f$.

In an embodiment, the material having the refractive index $n_r$ is made of resin.

In an embodiment, the material having the refractive index $n_r$ is made of UV-curable resin.

In an embodiment, minute unevenness is present on an inner wall of the second groove.

In an embodiment, the optical member selectively reflects light having a wavelength in a selected range.

In an embodiment, the optical member selectively passes light having a wavelength in a selected range.

In an embodiment, the optical member includes a base made of a material having a refractive index $n_b$ and a dielectric multi-layer film formed on the base, and there is a relationship: $0.9 \leq (n_b/n_f) \leq 1.1$ between the refractive index $n_b$ and the refractive index $n_f$.

In an embodiment, the surface of the optical member has a diffraction grating.

In an embodiment, the substrate is made of a material which is transparent to signal light propagating through the optical fiber.

In an embodiment, the substrate is made of a glass material.

In an embodiment, the substrate is made of a plastic material.

In an embodiment, the bidirectional signal light has wavelengths different from each other, the optical member has a base which is transparent and has a refractive index almost equal to a refractive index of the optical fiber and two reflective coatings formed on two principal planes of the base, and the two reflective coatings exhibit different reflection characteristics, respectively.

In an embodiment, the reflective coating is made of a metal thin film.

In an embodiment, the two reflective coatings respectively have a multi-layer thin film structure.

In an embodiment, each of the two photodetectors is provided in a can-shaped housing by sealing, and two concave portions are formed on the substrate so as to engage with the can-shaped housings.

In an embodiment, the two photodetectors are connected to an electric wiring pattern formed on the substrate.

In an embodiment, the electric wiring pattern is connected to an electric integrated circuit element which detects an electric signal output from at least one of the two photodetectors and processes the electric signal.

In an embodiment, the optical fiber has a first portion which functions as a single mode fiber in a wavelength band of signal light propagating through the optical fiber, a second portion which functions as a multi-mode fiber in the wavelength band of the signal light, and a connecting portion connecting the first portion to the second portion, and a core diameter of the connecting portion gradually and continuously changes from the first portion to the second portion.

In an embodiment, the substrate is accommodated in a housing having an output port of the optical fiber and a plurality of terminals electrically connected to outside.

In an embodiment, a wavelength of light propagating bidirectionally through the optical fiber is in a 1.3 μm band and/or a 1.5 μm band, and a wavelength of unnecessary light which is removed by the second optical member is in a 0.98 pm band or a 1.48 pm band.

A method for producing an optical device of the present invention includes the steps of: forming a first groove on an upper surface of a substrate; embedding and fixing a part of an optical fiber in the first groove; forming a second groove so as to diagonally traverse the optical fiber; and inserting and fixing an optical member having a surface which reflects or diffracts at least a part of light propagating through the optical fiber in the second groove.

In a preferred embodiment, the step of inserting and fixing the optical member in the second groove includes the step of embedding a material having a refractive index $n_r$ almost equal to a refractive index $n_f$ of a core portion of the optical fiber at least between the optical member and the optical fiber in the second groove.

In a preferred embodiment, there is a relationship: $0.9 \leq (n_r/n_f) \leq 1.1$ between the refractive index $n_r$ and the refractive index $n_f$.

In an embodiment, the above-mentioned method further includes the step of providing at least one photodetector on the substrate.

In an embodiment, the above-mentioned method further comprising the step of providing at least one photodetector on the substrate.

In an embodiment, the above-mentioned method further includes the step of providing at least one laser diode on the substrate.

Another method for producing an optical device of the present invention includes the steps of: forming a plurality of first grooves on an upper surface of a substrate; embedding and fixing a part of optical fibers in each of the plurality of first grooves; forming a second groove so as to diagonally traverse the plurality of optical fibers; and inserting and fixing an optical member having a surface which reflects or diffracts at least a part of light propagating through the optical fibers in the second groove.

In a preferred embodiment, an angle formed by a direction of a normal to the surface of the optical member and a direction of an optical axis of the optical fiber is in the range of 5° to 40°.

An optical device of the present invention includes: a substrate; at least one first groove formed on the substrate; an optical fiber provided in the first groove; and a facet of the surface which diagonally traverses the optical fiber. The device further includes: an optical member attached to the facet of the substrate with a material having a refractive index almost equal to a refractive index of a core portion of the optical fiber, having a surface which reflects or diffracts at least a part of light propagating through the optical fiber; and a photodetector provided on the substrate, receiving light reflected by the optical member of the part of the light propagating through the optical fiber.

In an embodiment, the photodetector is provided on a surface of the substrate on which the first groove is formed.

In an embodiment, the photodetector is provided on a surface opposite to the surface of the substrate on which the first groove is formed.

In an embodiment, the above-mentioned device includes: a third groove which traverses the optical fiber; and a second optical member inserted in the third groove, which reflects light in a specified wavelength region, wherein the second optical member prevents the light in the specified wavelength region propagating through the optical fiber from being incident upon the photodetector.

In an embodiment, the above-mentioned device includes an optical member attached to an upper surface of the substrate with a resin material having a refractive index almost equal to a refractive index of a core portion of the optical fiber, which reflects light in a specified wavelength region, wherein the photodetector is provided on the optical member.

In an embodiment, a filter having a dielectric multi-layer film structure is formed on a light-receiving surface of the photodetector.

In an embodiment, the optical fiber is connected to an optical fiber light transmission line.

In an embodiment, the optical fiber is provided with a ferrule portion so as to be connected to an optical fiber transmission line.

Another method for producing an optical device of the present invention includes the steps of: forming a first groove on a substrate; fixing an optical fiber in the first groove; diagonally cutting the optical fiber to form a facet tilted with respect to an optical axis of the optical fiber on the substrate; attaching an optical member having a surface which reflects or diffracts at least a part of light propagating through the optical fiber to the tilted facet with a material having a refractive index almost equal to a refractive index of a core portion of the optical fiber; and providing a photodetector which receives light reflected or diffracted by the optical member on the substrate.

As described above, in the optical device of the present invention, an optical fiber is embedded in a groove of a substrate, and an optical member which reflects or diffracts light propagating through the optical fiber is embedded in the substrate, whereby signal light can be taken out in any direction.

Furthermore, the light taken out in any direction is coupled to a semiconductor photodetector placed above the substrate without forming any unnecessary reflected point, by using resin whose refractive index is matched with that of the optical fiber. In particular, when a multi-mode optical fiber is used, the coupling is made easier.

The filter characteristics of the optical member are improved by embedding both sides of an element using a layer having a multi-layer film structure composed of a dielectric and metal with a resin material having a refractive index almost equal to that of the optical fiber, or by embedding only a plane different from a principal plane of a certain kind of optical member with a resin material having a refractive index almost equal to that of the optical fiber.

Light to be taken out by diffraction is coupled to a semiconductor photodetector array or taken outside using another optical fiber, whereby only light with a desired wavelength can be easily separated from light signals having a plurality of different wavelengths.

In the case where the optical fiber is a multi-mode optical fiber connected to a single mode fiber, with a core diameter of a connecting portion thereof gradually and continuously changing, or in the case where the optical fiber is a multi-mode fiber obtained by heat-treating the single mode fiber and the optical fiber, light can be coupled to the single mode fiber at high efficiency by coupling light to the multi-mode fiber with a mode diameter increased.

When a semiconductor laser is placed on a concave portion of a substrate and an optical fiber having a lens function is used, light can be easily coupled to the optical fiber. When a movable portion is provided at a part of the embedded optical fiber, the semiconductor laser is connected to the substrate, and then, the movable portion of the optical fiber is adjusted, whereby the coupling degree of light to the optical fiber can be increased.

When a semiconductor laser and a lens are provided on different substrates, and an optical fiber is provided on an embedding substrate, the semiconductor laser can be used after its characteristics are tested, so that the yield of the optical device can be improved. Light of the semiconductor laser can be coupled to the optical fiber with low precision of about several $\mu$m by prescribing an imaging spot of light of the semiconductor laser formed by the lens to be almost equal to that of the multi-mode fiber.

When light is taken out from a substrate through a multi-mode fiber, all the light is taken in a semiconductor light-receiving apparatus, whereby an analog signal can be received without any degradation of quality.

An electric wiring pattern for connection to semiconductor light-receiving and light-emitting devices can be formed on the surface of a substrate, and particularly in the case of a high frequency signal, the impedance can be matched to that of an electric circuit connected to outside. Furthermore, when an electric element which processes an electric signal is integrally formed in addition to the semiconductor light-receiving and light-emitting devices, an electric matching becomes satisfactory and the optical device can be miniaturized.

When different reflective elements are arranged so as to separately receive signals with different wavelengths from an optical fiber embedded in a substrate, a light signal transmitted with wavelengths being multiplexed can be selectively taken out of one substrate.

When a plurality of optical fibers are arranged in an array on a substrate, light signals are independently transmitted in parallel through a plurality of optical fibers in one substrate.

After devices are formed on a substrate, the surface of the substrate is covered with a resin material, whereby a semiconductor device provided on the surface of the substrate can be protected from water, an atmosphere, etc. from outside. The substrate can be accommodated as it is in a housing having an optical fiber output port and electric connection terminals.

Furthermore, the melting point of a first solder material between a semiconductor laser and a substrate is prescribed to be higher than that of a second solder material between the substrate and another substrate, and the melting point of the second solder material is prescribed to be higher than that of a third solder material connecting the substrate to the housing. Thus, devices are prevented from moving during the respective connections using the solder material, whereby reliability can be secured.

BRIEF DESCRIPTION OF THE DRAWINGS

FIG. 9A is a plan view of the fourth example of an optical device according to the present invention.

FIG. 9B is a cross-sectional view of the fourth example according to the present invention taken along an optical fiber.

FIG. 10A is a plan view of the fifth example of an optical device according to the present invention.

FIG. 10B is a cross-sectional view of the fifth example according to the present invention taken along an optical fiber.

FIG. 11A is a perspective view of the sixth example of an optical device according to the present invention.

FIG. 11B is a cross-sectional view of the sixth example according to the present invention.

FIG. 12A is a perspective view of the seventh example of an optical device according to the present invention.

FIG. 12B is a cross-sectional view of the seventh example according to the present invention.

FIG. 18A is a schematic cross-sectional view of an ordinary optical fiber; FIG. 18B is a schematic cross-sectional view of an optical fiber with its core diameter partially enlarged.

FIGS. 26A and 26B are views respectively showing a structure of the sixteenth example.

BEST MODE FOR CARRYING OUT THE INVENTION

An optical device according to the present invention includes an optical fiber provided in a first groove of a substrate and at least one second groove which diagonally traverses the optical fiber. The optical device has an optical member which is inserted in the second groove and reflects or diffracts at least a part of light propagating through the optical fiber. The optical member enables photodetectors or the like arranged in line to receive light propagating through the optical fiber. As a result, light passed through the second groove and the optical member therein can be utilized, and another light signal can be guided into the optical fiber through the end thereof. This makes it possible to provide a compact light transmission terminal in which an optical fiber and a photodetector or a light-emitting device are integrated in various arrangements.

In particular, in the case where a gap between the optical member and the optical fiber in the second groove is filled with a material having a refractive index almost equal to that of a core portion of the optical fiber, even when minute unevenness is present on an inner wall of the second groove, light propagating through the optical fiber is not subject to unnecessary scattering and refraction due to the inner wall of the second groove. This makes it very easy to form the second groove; for example, the inner wall of the second groove is not required to be made smooth by grinding.

Furthermore, according to the present invention, the second groove is formed after the optical fiber is placed in the first groove of the substrate, so that a special optical axis alignment step is not required, substantially simplifying the production process.

Hereinafter, the present invention will be described by way of illustrative examples with reference to the drawings.

EXAMPLE 1

Figure 1A:
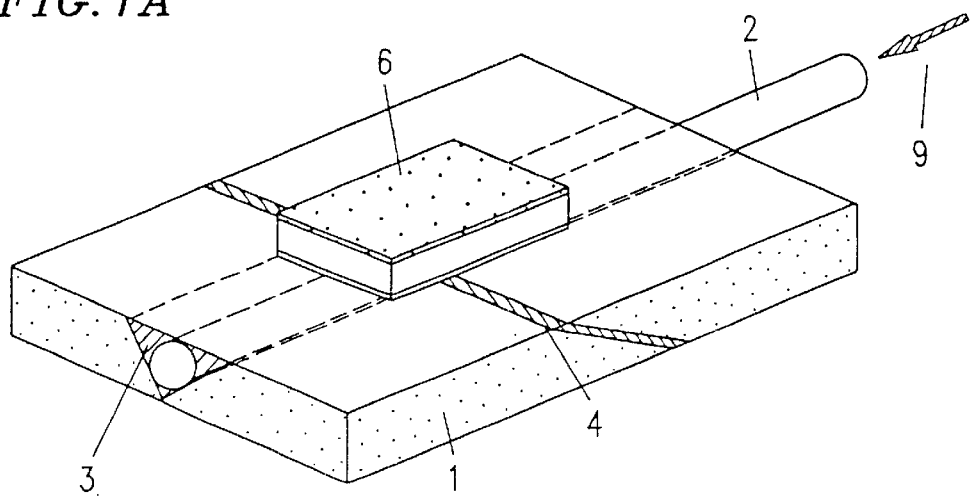
FIG. 1A is a perspective view of the first example of an optical device according to the present invention.
Figure 1B:
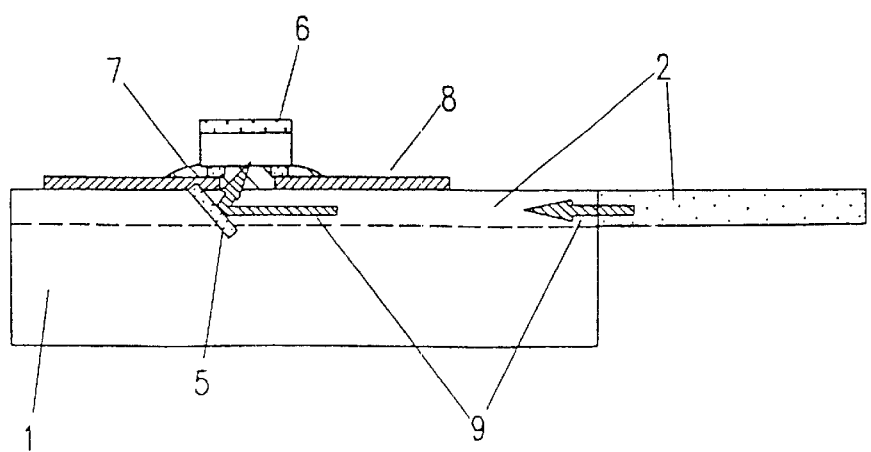
FIG. 1B is a cross-sectional view of the first example of an optical device according to the present invention taken along an optical fiber.

First, referring to FIGS. 1A and 1B, the first example of an optical device according to the present invention will be described. FIG. 1A is a perspective view showing only the uppermost portion of the first example of an optical device (light-receiving module) of the present example; FIG. 1B is a cross-sectional view of the optical device taken along an optical fiber.

The optical device is constructed, using a glass substrate (thickness: 2 mm; 5 mm long and 3 mm wide) 1 with a V-groove (first groove) 3 having a depth of about 130 $\mu$m formed on an upper flat surface. An optical fiber 2 having an outer diameter of 125 $\mu$m is placed in the V-groove 3, and a parallel groove (second groove) 4 is formed on the upper surface of the glass substrate 1 so as to diagonally traverse the optical fiber 2 (with respect to its optical axis). A slit is diagonally formed in the optical fiber 2 due to the parallel groove 4, whereby the optical fiber 2 is separated into two portions spatially apart from each other. In the present example, the parallel groove 4 is formed in such a manner that the normal to the inner wall of the parallel groove 4 forms an angle of 30° with respect to the optical axis.

The V-groove 3 is designed so as to have a size capable of stably holding the optical fiber 2. The depth of the V-groove 3 is preferably prescribed so as to accommodate the optical fiber 2 completely therein. However, there is no substantial problem, even when the uppermost portion of the optical fiber 2 is positioned slightly above the upper surface of the substrate 1. Grooves having rectangular or U-shaped cross sections in the direction perpendicular to the optical axis may be used in place of the V-groove 3.

The parallel groove 4 preferably has a width (gap of the inner walls of the groove or gap between the separated two optical fibers) of about 100 $\mu$m or less. According to the present invention, an optical member is inserted into the parallel groove 4. In the case of the present example, a light reflective element (thickness: 80 $\mu$m) 5 having filter characteristics which selectively reflects light in a 1.55 $\mu$m band is inserted into the parallel groove 4. The light reflective element 5 has a quartz base substrate and a dielectric multi-layer film (filter film) composed of a silicon oxide film and a titanium oxide film alternately formed on at least one principal plane, thereby providing the filter characteristics which exhibit high reflectance with respect to light in a particular wavelength range. The light reflective element 5 is not required to be completely accommodated in the parallel groove 4. The light reflective element 5 may partially project from the upper surface of the substrate 1, as long as it is positioned so as to receive signal light propagating through the optical fiber 2.

In order to stably fix the light reflective element 5 in the parallel groove 4, UV-curable resin 7 is used. This resin is selected so as to become substantially transparent with respect to light with a wavelength of signal light (1.55 $\mu$m band in the present example) at least after being cured.

Figure 2:
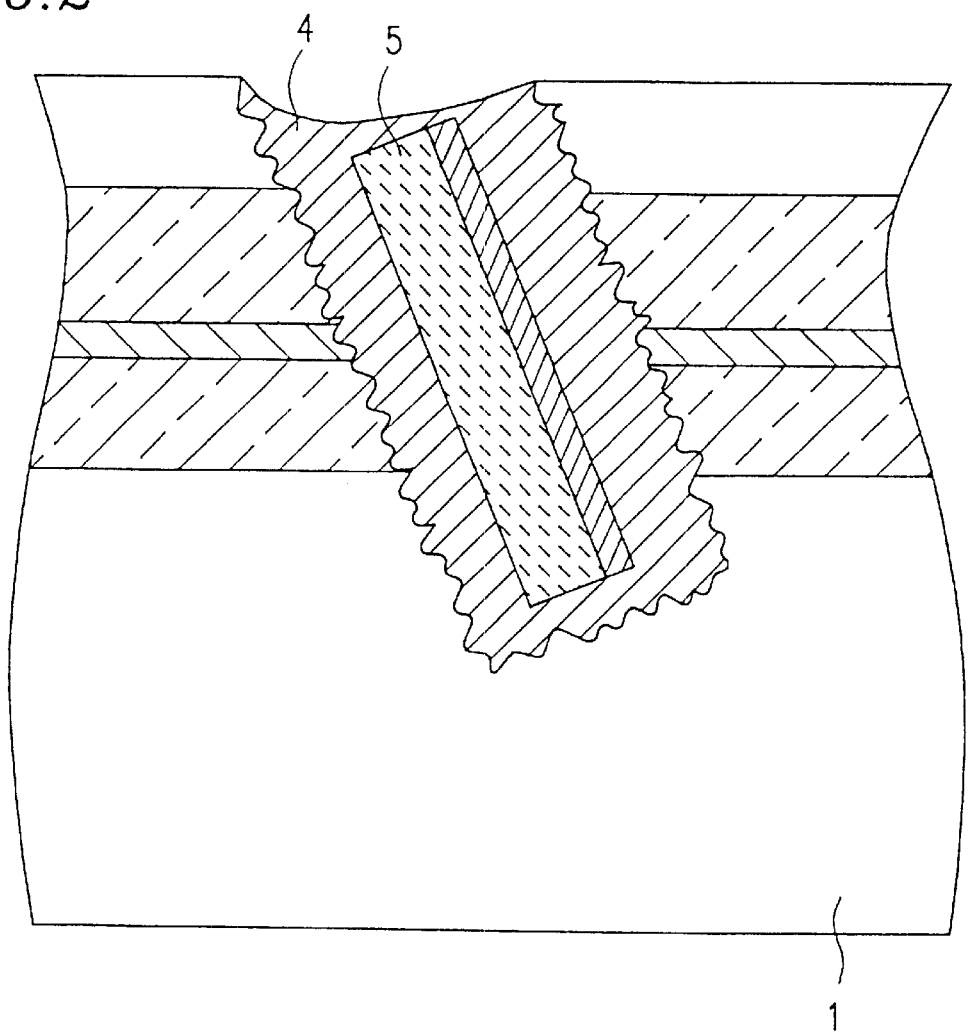
FIG. 2 is a cross-sectional view showing a reflective element and the detail of the periphery thereof.

FIG. 2 is a cross-sectional view showing the detail of the vicinity of the parallel groove 4 and the element 5. The inner walls of the parallel groove 4, more specifically, the facets of the portions of the optical fiber 2 facing each other through the parallel groove 4 diagonally traverse the optical axis of the optical fiber 2. Because of this, when a material having a refractive index different from a refractive index $n_f$ of a core portion of the optical fiber is present in the parallel groove 4, light propagating through the optical fiber 2 is refracted in the parallel groove 4. This may cause a transmission loss in the parallel groove 4. Furthermore, during the step of forming a parallel groove such as dicing, the inner wall of the parallel groove 4 is subject to damage (mechanical/chemical damage), and minute unevenness is likely to be formed on the inner wall of the parallel groove 4.

Even in the above-mentioned cases, if the gap between the inner wall of the parallel groove 4 and the light reflective element 5 is filled with a material having a refractive index $n_r$ almost equal to the refractive index $n_f$ of the core portion of the optical fiber 2, light propagating through the optical fiber 2 is transmitted straight between the portions of the optical fiber over the parallel groove 4 without being sensitive to the minute unevenness and without changing the optical axis. According to an experiment, it is found that there is preferably a relationship $0.9 \leq (n_r/n_f) \leq 1.1$ between the refractive index $n_r$ and the refractive index $n_f$. Hereinafter, unless otherwise specified, any resin referred to in the present specification is intended to have a refractive index satisfying the above relationship.

Referring to FIGS. 1A and 1B again, an InGaAs semiconductor photodetector 6 for detecting signal light in a 1.55 $\mu$m band reflected by the light reflective element 5 is provided on the upper surface of the substrate 1. An electrode 8 for interconnecting the semiconductor photodetector 6 to an external circuit is formed on the upper surface of the substrate 1.

An arrow 9 in these figures shows the path of a light signal with a wavelength in a 1.55 $\mu$m band transmitted from the other end of the optical fiber 2. Light having a wavelength greatly shifted from the wavelength of this light signal is hardly reflected by the light reflective element 5 and passed therethrough without reaching a light-receiving portion of the semiconductor photodetector 6.

Figure 3:
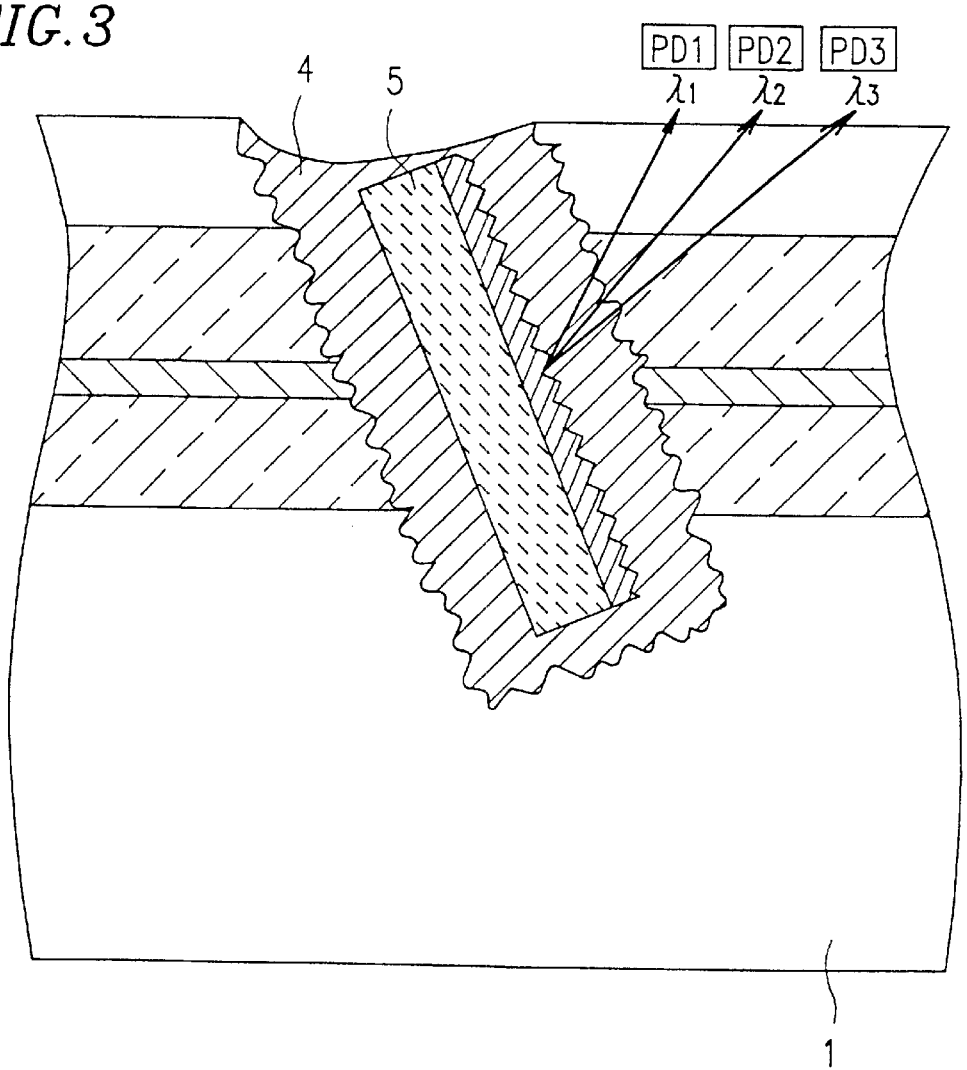
FIG. 3 is a cross-sectional view showing another reflective element and the detail of the periphery thereof.

FIG. 3 shows an example in which a unit with a diffraction grating formed thereon is inserted into the parallel groove 4 as an optical member in place of the light reflective element 5 with a filter film formed thereon. This diffraction grating diffracts light propagating through the optical fiber 2, whereby a plurality of diffracted light beams are formed. The light-receiving portion of the photodetector is placed at a position where a diffracted light beam having an order of the highest degree of intensity among these diffracted light beams can be received. In the case where a plurality of signal light beams having different wavelengths propagate through the optical fiber, the diffraction angle is varied depending upon the wavelength. Therefore, the signal light beams can be separately detected by placing the light-receiving portions (e.g., photodiodes PD1, PD2, and PD3) at different positions with respect to each signal light. In order to miniaturize the photodetector, these plurality of light-receiving portions are preferably provided on one semiconductor substrate.

Next, referring to FIGS. 4A through 4C, the traveling paths of the signal light beams reflected by the element 5 will be described.

Figure 4A:
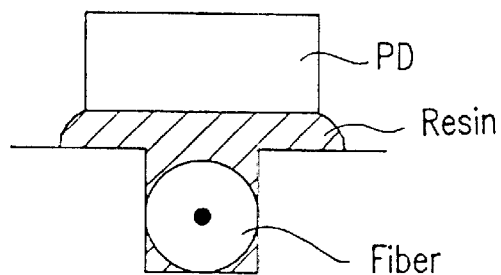
FIG. 4A is a transverse cross-sectional view of an optical fiber and a photodetector.

As shown in FIG. 4A, in the present example, resin is provided between the optical fiber and the photodetector. The resin having a refractive index $n_r$ almost equal to the refractive index $n_f$ of the core portion of the optical fiber is selected. This resin is provided so as to at least fill the path of the signal light. In the case where the path of the signal light is not filled with the resin, the signal light is diffracted or scattered, so that the photodetector cannot efficiently receive the signal light. Furthermore, in such a case, since the optical fiber has a cylindrical structure, the path of the signal light becomes complicated due to a lens effect.

Figure 4B:
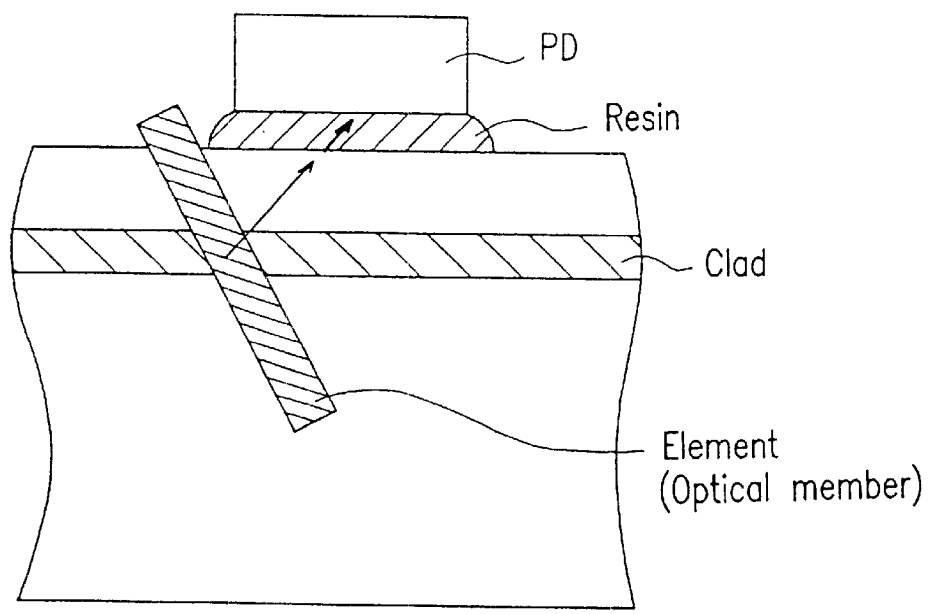
FIG. 4B is a vertical cross-sectional view of an optical fiber and a photodetector.
Figure 4C:
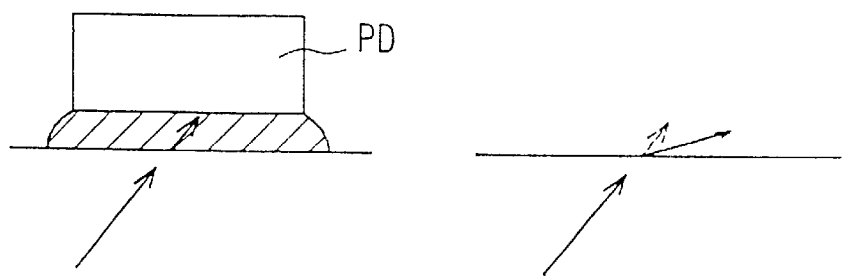
FIG. 4C is a vertical cross-sectional view showing refraction of signal light.

As in the present example, the signal light can be incident straight upon the light-receiving portion of the photodetector as shown in FIG. 4B by inserting the resin having a refractive index $n_r$ almost equal to the refractive index $n_f$ of the core portion of the optical fiber. FIG. 4C schematically shows how the path of the signal light changes depending upon the presence of the resin. When the signal light is diffracted or scattered, the spot size of the signal light on the light-receiving portion becomes larger, resulting in the decrease in detection sensitivity and response speed of the photodetector. According to an experiment, it is found that there is preferably a relationship $0.9 \leq (n_r/n_f) \leq 1.1$ between the refractive index $n_r$ and the refractive index $n_f$. Materials other than the resin may be used, as long as they have the similar refractive index.

As described above, in the arrangement of the present example, the signal light selectively reflected by the light reflective element 5 is not passed through the substrate 1. Therefore, the substrate 1 is not necessarily transparent to the signal light. A ceramic substrate or a semiconductor substrate may be used in place of the glass substrate 1. In the case of using a semiconductor substrate, a circuit to be connected to the photodetector can be previously formed on the identical semiconductor substrate.

Hereinafter, the operation of the optical device shown in FIG. 1A and 1B will be described.

A light signal (e.g., laser light in a 1.55 μm band) transmitted through the optical fiber 2 is diagonally reflected by the light reflective element 5 in the parallel groove 4 formed diagonally with respect to the optical axis of the optical fiber 2. More specifically, in the case where the normal to the inner wall of the parallel groove 4 (more accurately, "normal to the principal plane of the light reflective element 5") and the optical axis of the optical fiber 2 forms an angle of about 30°, the signal light is reflected so that the angle formed by the reflected light and the optical axis of the optical fiber 2 becomes about 60°. On the other hand, in the case where light which is not in a 1.55 μm band, e.g., light having a wavelength shifted by about 0.2 μm or more from the 1.55 μm band is transmitted through the optical fiber 2, the light is almost passed through the light reflective element 5 without being reflected.

In the case of the present example, as understood from FIG. 1A, the parallel groove 4 is directed in such a manner that a plane including the above-mentioned normal and the optical axis of the optical fiber is perpendicular to the upper surface of the substrate 1.

Such an arrangement allows the light signal in a desired wavelength range to be selectively taken out of the glass substrate 1 from the upper surface thereof. The semiconductor photodetector 6 for detecting a light signal is placed at a position where the light signal thus taken out can be received.

The light signal in a 1.55 μm band is converted into an electric signal by the semiconductor photodetector 6 and taken out of the electrode 8. The resin 7 is selected so as to crimp an electrode of the semiconductor photodetector 6 onto the electrode 8 and to have a refractive index which does not cause the light signal taken out of the optical fiber 2 to be refracted or scattered.

The surface of the semiconductor photodetector 6 is previously provided with a low reflectance coating so that the light signal is not reflected by the surface of a semiconductor layer (light-receiving surface). Because of this, the light signal with a wavelength of 1.55 μm propagating through the optical fiber 2 is almost taken in the light-receiving portion of the semiconductor photodetector 6.

The semiconductor photodetector 6 used herein includes an InP semiconductor crystal substrate which is transparent to a light signal with a wavelength of 1.55μm. Therefore, the light signal may be incident upon a crystal growth side or a crystal substrate side.

In the light-receiving optical device, the distance between the output point of a light signal of the optical fiber 2 and the light-receiving portion of the semiconductor photodetector can be set to be short (about 60 to 300 μm) at a constant value with good reproducibility. Therefore, light is prevented from spatially diffusing from the output point of a light signal to reach a region other than the light-receiving portion of the semiconductor photodetector. As a result, 90% or more of the light signal with a wavelength of 1.55 μm propagating through the optical fiber 2 is taken in the semiconductor photodetector 6, whereby a high light-receiving efficiency is easily achieved. Furthermore, unlike a conventional light-receiving semiconductor device, there are no problems such as the degradation of a signal due to the multiple reflection effect of a light signal between a plurality of facets including a light-output facet of an optical fiber, a lens facet, a facet of a semiconductor photodetector, etc. Thus, the above-mentioned optical device can also be used for receiving light in an analog light signal transmission system which requires a high signal quality. Furthermore, all the components are fixed to the glass substrate 1, so that the characteristics are not changed due to the positional shift caused by external vibration and the changes in outside temperature, and the device has outstanding long-term reliability.

Next, a method for producing the above-mentioned light-receiving optical device will be described.

First, a V-groove 3 is formed on the upper surface of a glass substrate 1 by mechanical cutting. Then, a conductive thin film is deposited on the surface of the glass substrate 1, e.g., by a vacuum deposition method. Thereafter, the conductive thin film is processed in a desired electrode pattern during a photolithography step and an etching step, and an electrode 8 is formed of the patterned conductive thin film. At this time, it is preferable that the electrode 8 is formed, and "alignment marks" showing a position where a parallel groove 4 is to be provided and a position where a photodetector is to be provided is formed on the glass substrate 1 during these steps.

Next, an optical fiber 2 is buried in the Vgroove 3 with a resin material.

After the resin is cured, the parallel groove 4 is formed at the position on the glass substrate 1 shown by the above-mentioned alignment mark. The parallel groove 4 can be easily formed by a cutting apparatus called a wire-saw or a dicing saw.

Then, a light reflective element 5 is inserted into the parallel groove 4 together with resin, and the resin is cured. At this time, it is preferable that the refractive index of the resin is set to be almost the same as that of a core portion of the optical fiber 2. An excess light loss (scattering of a light signal) caused by the roughness of the inner wall (cut surface) of the parallel groove 4 can be suppressed by setting the refractive index of the resin to be almost the same as that of the core portion of the optical fiber 2. UV-curable resin is preferably used. This is because a heating step for curing is not required.

Next, the semiconductor photodetector 6 is fixed at the position on the glass substrate 1 shown by the alignment mark, using resin 7. The alignment is conducted by aligning the alignment mark on the glass substrate 1 with the semiconductor photodetector 6 while observing them from above the glass substrate 1. If a method for previously forming a mark which shows the position of the light-receiving portion on the semiconductor photodetector 6 side is used, the alignment can be conducted with higher precision.

In the case where a light signal is incident upon the crystal substrate side of the semiconductor photodetector 6 as described above, a mark showing the position of the light-receiving portion can be formed on an InGaAs crystal growth layer side which is to be the front surface when the photodetector 6 is mounted. Because of this, the alignment mark can be formed simultaneously, for example, while an electrode of the semiconductor photodetector 6 is formed, so that a part of the production of the semiconductor photodetector 6 becomes easy. When a resin material which is cured by UV-irradiation from outside is used, a semiconductor photodetector can be fixed at a predetermined position without requiring a long-term curing time.

When the above-mentioned photodetector is produced, it is not required to three-dimensionally adjust the positions of each component while a light signal from an optical fiber is detected. Therefore, such a device can be produced by using a mounting apparatus conducting a two-dimensional adjustment as used in a mounting technique in the field of the production of a silicon integrated circuit apparatus. Thus, the device is suitable for mass-production in a short period of time, and it can be expected that the device is produced at low cost.

EXAMPLE 2

Figure 5:
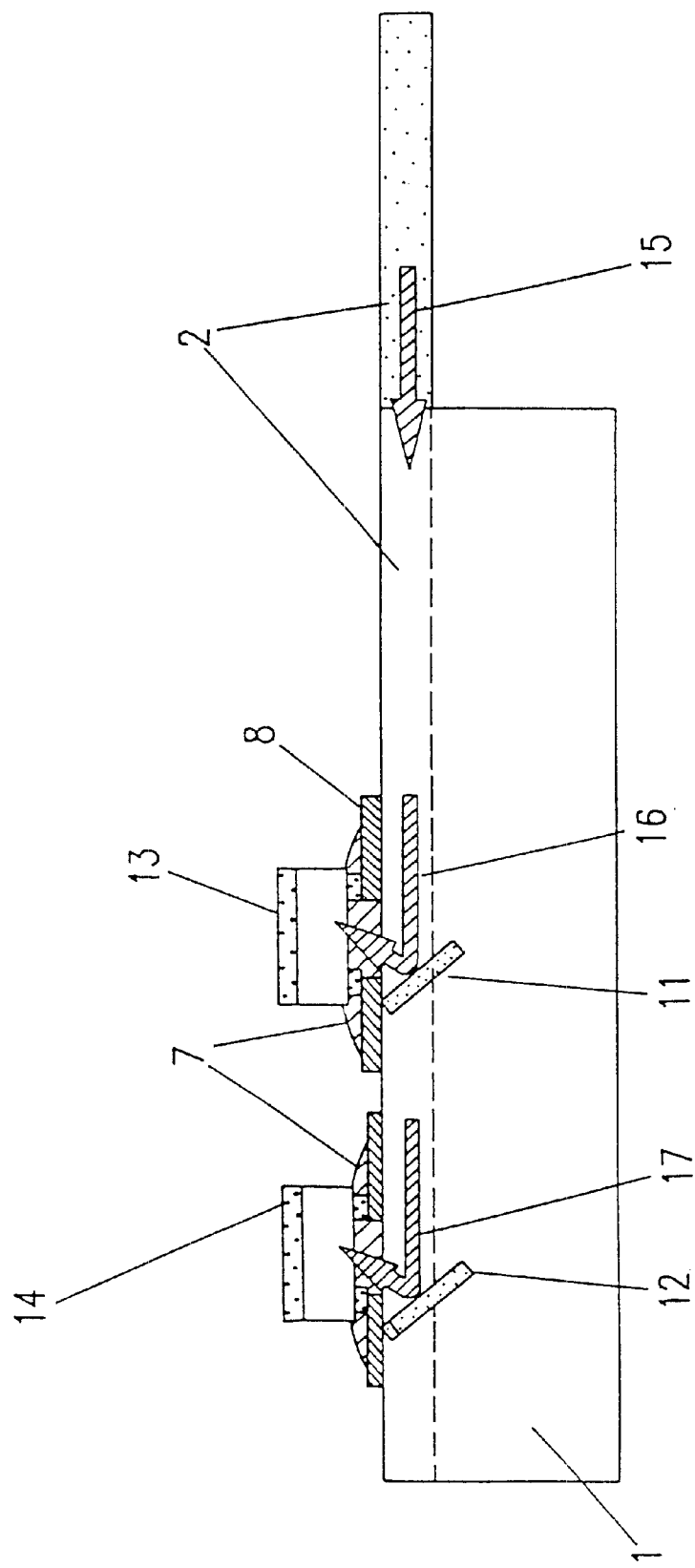
FIG. 5 is a cross-sectional view of the second example of an optical device according to the present invention taken along an optical fiber.

Next, referring to FIG. 5, the second example of a light-receiving apparatus according to the present invention will be described. FIG. 5 is a cross-sectional view of a light-receiving optical device which receives signal light with a wavelength $\lambda 1$ of 1.55 $\mu$m and a light signal with a wavelength of $\lambda 2$ of 1.31 $\mu$m. In the following description, the components identical with those described in the previous example are denoted by the reference numerals identical therewith, and the detailed description thereof may be omitted.

As shown in FIG. 5, two parallel grooves (groove width: about 100 $\mu$m) are formed in a glass substrate 1 so as to form a predetermined angle with respect to the optical axis of an optical fiber 2. In the present example, the angles formed by each parallel groove and the optical axis are equal. However, they may be different from each other.

The optical fiber 2 is fixed with resin in a groove formed on the upper surface of the glass substrate 1, as described in Example 1.

Different kinds of light reflective elements 11 and 12 are inserted into the above-mentioned two parallel grooves, respectively. The light reflective element (thickness: 80 $\mu$m) 11 has filter characteristics which reflect 99% or more of signal light with a wavelength $\lambda 1$ of 1.55 $\mu$m, and the light reflective element (thickness: 80 $\mu$m) 12 has filter characteristics which reflect 99% or more of signal light with a wavelength $\lambda 2$ of 1.31 $\mu$m. The light reflective element 11 passes about 95% or more of signal light with a wavelength $\lambda 2$ of 1.31 $\mu$m.

An InGaAs semiconductor photodetector 13 is placed on the glass substrate 1 so as to receive signal light with a wavelength $\lambda 1$ of 1.55 $\mu$m reflected by the light reflective element 11. An InGaAs semiconductor photodetector 14 is placed on the glass substrate 1 so as to receive signal light with a wavelength $\lambda 2$ of 1.31 $\mu$m reflected by the light reflective element 12. Arrows 15, 16, and 17 represent the path of signal light transmitted from one end of the optical fiber 2.

The operation of the optical device of the present example is as follows.

At a position of the path 15 of a light signal, light transmitted through the optical fiber 2 contains at least signal light with a wavelength $\lambda 1$ of 1.55 $\mu$m and signal light with a wavelength $\lambda 2$ of 1.31 $\mu$m. The light reflective element 11 selectively reflects only a light signal with a wavelength of 1.55 $\mu$m, and gives the reflected light to the semiconductor photodetector 13 (path 16). The semiconductor photodetector 13 generates an electric signal in response to the received light signal.

On the other hand, a light signal with a wavelength of 1.31 $\mu$m is passed through the light reflective element 11 and selectively reflected by the light reflective element 12. The reflected light is given to the semiconductor photodetector 14, and the semiconductor photodetector 14 generates an electric signal in response to the received light signal.

Resin 7 is selected so as to crimp electrodes of the photodetectors 13 and 14 onto an electrode 8 and to have a refractive index which does not cause the light signal taken out of the optical fiber 2 to be reflected.

The surfaces of the semiconductor photodetectors 13 and 14 are previously provided with a low reflectance coating so that the light signal is not reflected by the surfaces of semiconductor layers. Because of this, the light signal with a wavelength of 1.55 $\mu$m propagating through the optical fiber 2 is taken in the semiconductor photodetector 13, and the light signal with a wavelength of 1.31 $\mu$m is taken in the semiconductor photodetector 14.

In the light-receiving apparatus, the distance between the output point of a light signal of the optical fiber 2 and the light-receiving portion of the semiconductor photodetector can be set to be short (about 60 to 300 $\mu$m) at a constant value with good reproducibility. Therefore, light is prevented from spatially diffusing from the output point of a light signal to reach a region other than the light-receiving portion of the semiconductor photodetector. As a result, 90% or more of the light signal with a wavelength of 1.55 $\mu$m propagating through the optical fiber 2 is taken in the semiconductor photodetector 13, and 80% or more of the light signal with a wavelength of 1.31 $\mu$m propagating through the optical fiber 2 is taken in the semiconductor photodetector 14, whereby a high light-receiving efficiency is easily achieved. Furthermore, unlike a conventional light-receiving semiconductor device, there are no problems such as the degradation of a signal due to the multiple reflection effect of a light signal between a plurality of facets including a light-output facet of an optical fiber, a lens facet, a facet of a semiconductor photodetector, etc. Thus, the above-mentioned optical device can also be used for receiving light in an analog light signal transmission system which requires a high signal quality. Furthermore, all the components are fixed to the glass substrate 1, so that the characteristics are not changed due to the positional shift caused by external vibration and the changes in outside temperature, and the device has outstanding long-term reliability. The semiconductor photodetectors 13 and 14 may be two semiconductor photodetectors formed on the identical semiconductor substrate.

Figure 6:
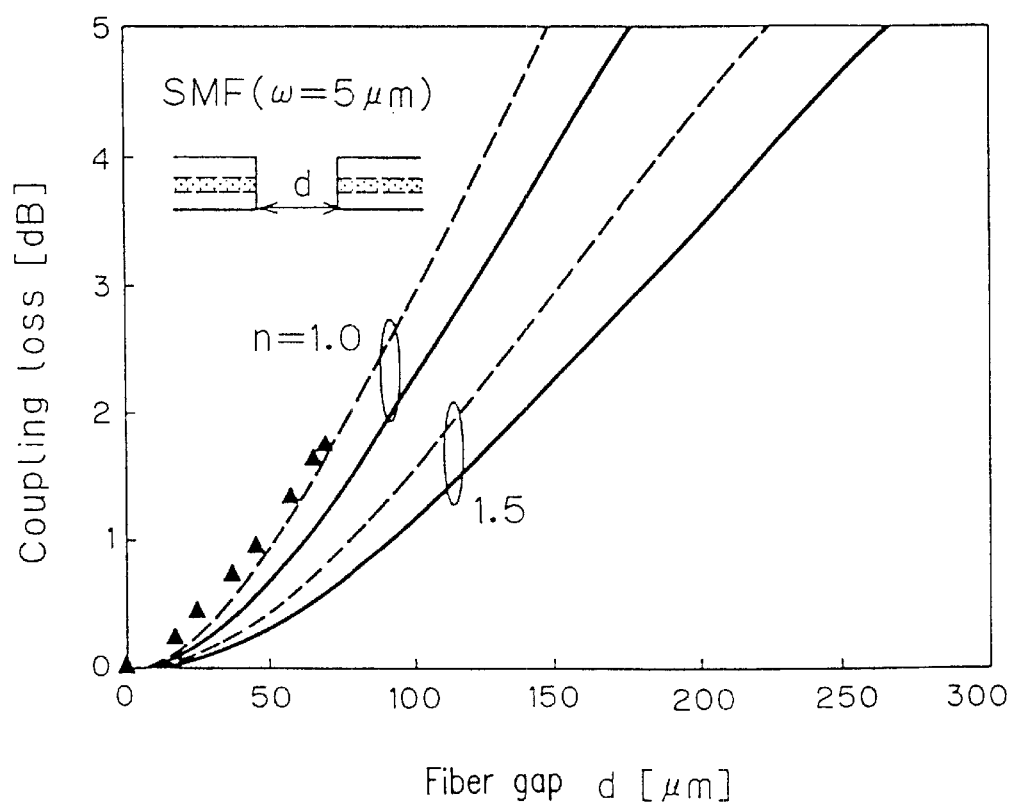
FIG. 6 illustrates the dependence of a coupling loss between fibers on a fiber gap.

Next, referring to FIG. 6, the loss of a light signal passed through the parallel groove will be described. FIG. 6 shows a calculated result and an experimental result of a light loss caused by the gap provided in a single mode fiber. It is assumed that a material with a refractive index n is present in the gap. A solid line in FIG. 6 shows the loss of a light signal with a wavelength of 1.31 $\mu$m, and a broken line shows the loss of a light signal with a wavelength of 1.55 $\mu$m. Two groups of curves are shown, one group corresponding to the case of a refractive index of the gap n of 1.0 and the other group corresponding to the case of a refractive index of the gap n of 1.5.

The refractive index of the resin used in the present example is about 1.5. It is understood from FIG. 6 that, in the case of a refractive index n of 1.5, only a small coupling loss of about 1 dB occurs with respect to the gap with a width of 100 $\mu$m. This coupling loss can be reduced by making the gap between fibers smaller, and it can also be reduced by increasing the core diameter of an optical fiber.

When the above-mentioned light-receiving apparatus is produced, it is not required to three-dimensionally adjust the positions of each component while a light signal from an optical fiber is detected. Therefore, such a device can be produced by using a mounting apparatus conducting a two-dimensional adjustment as used in a mounting technique in the field of the production of a silicon integrated circuit apparatus. Thus, the device is suitable for mass-production in a short period of time, and it can be expected that the device is produced at low cost.

The light-receiving apparatus of the present example may be modified in such a manner that three or more kinds of light signals with different wavelengths are detected.

EXAMPLE 3

Next, referring to FIGS. 7A, 7B, and 8, the third example of a device according to the present invention will be described.

Figure 7A:
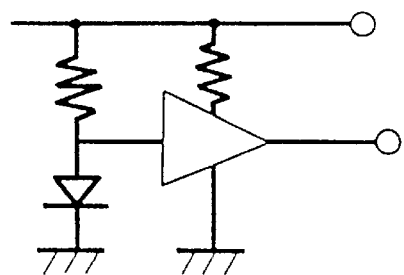
FIG. 7A is a circuit diagram of the third example of an optical device according to the present invention.

In the apparatus of the present example, a photodetector which receives a light signal with two wavelengths as shown in FIG. 5 and an electric amplifier are hybrid-integrated on one substrate. FIG. 7A is an equivalent circuit showing a part of a circuit of the device of the present example; FIG. 7B is a schematic perspective view thereof; and FIG. 7C is a plan view thereof.

Figure 7B:
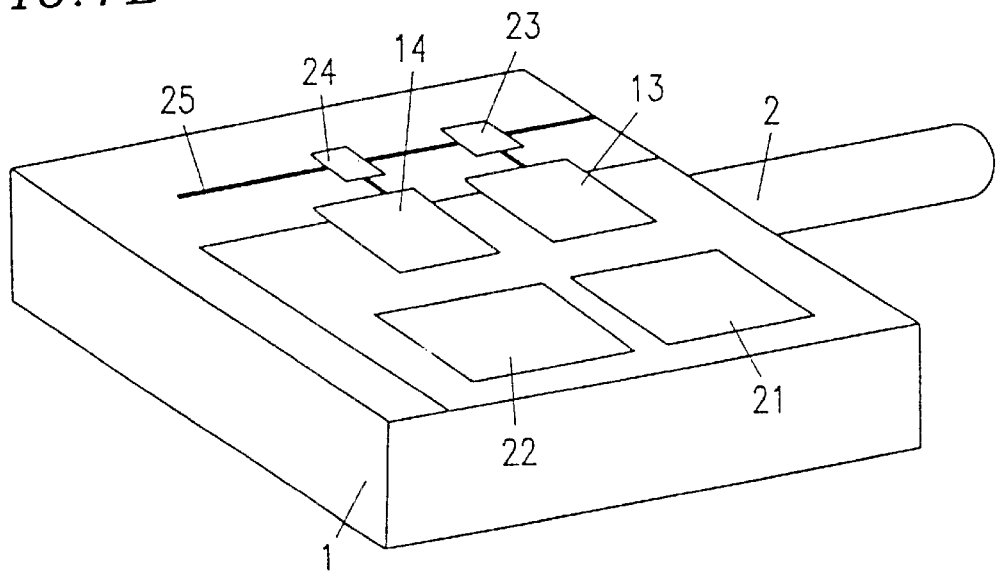
FIG. 7B is a perspective view of the third example according to the present invention.
Figure 7C:
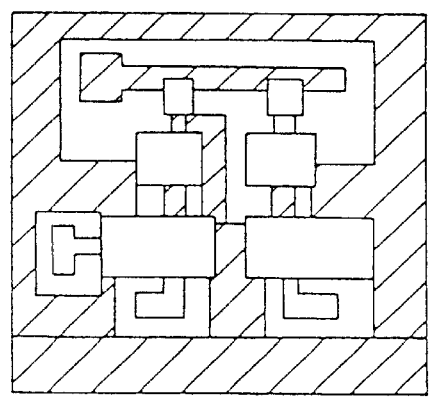
FIG. 7C is a plan view of the third example according to the present invention.

As shown in FIG. 7B, photodetectors 13 and 14 as shown in FIG. 5 are formed on a substrate 1. The photodetectors 13 and 14 respectively detect signal light in a selected wavelength band among light propagating through an optical fiber 2 embedded in a groove (not shown), as described in Example 2.

The photodetector is represented by a symbol of a photodiode in FIG. 7A. When the photodetector receives signal light, an electric potential at a portion between the photodiode and a resistor changes. The electric amplifier amplifies the change in electric potential and outputs it.

Referring to FIG. 7B, a first electric amplifier 21 is electrically connected to a first photodetector 13, and a second electric amplifier 22 is electrically connected to a second photodetector 14.

The first photodetector 13 is connected to an electric wiring pattern 25 through a first resistor 23, and the second photodetector 14 is connected to an electric wiring pattern 25 through a second resistor 24.

A light signal with a wavelength of 1.55 $\mu$m among light signals transmitted through the optical fiber 2 is converted into an electric signal by the first photodetector 13, input to the first electric amplifier 21, and amplified therein. Thereafter, the amplified electric signal is taken out by an electrode pattern (not shown) in FIG. 7B. A light signal with a wavelength of 1.31 $\mu$m is converted into an electric signal by the second photodetector 14 without being detected by the first photodetector 13, input to the second electric amplifier 22, and amplified therein. The amplified signal is taken out by an electrode pattern (not shown) in FIG. 7B.

The device shown in FIG. 7B is produced as follows.

First, an electrode wiring pattern 25 is formed on a glass substrate 1. The electrode wiring pattern 25 is formed by vapor-depositing a conductive thin film made of an electrode material onto the glass substrate 1, followed by photolithography and etching. During these steps, various "alignment marks" can be formed of a conductive thin film together with the electrode wiring pattern 25. A shaded portion of FIG. 7C shows an example of an electrode wiring pattern.

Next, a V-groove is formed at a predetermined position of the glass substrate 1 based on the "alignment mark" showing the position where the V-groove is to be formed. Thereafter, an optical fiber 2 is embedded in the V-groove and fixed therein with resin. Then, two parallel grooves (not shown) are formed on the glass substrate 1 based on the "alignment marks" showing the positions where the parallel grooves are to be formed. Light reflective elements 11 and 12 are fixed in the parallel grooves with resin. Thereafter, terminal electrodes of photodetectors 13 and 14 are arranged so as to be connected to a part of the electrode pattern 25, and fixed onto the glass substrate 1 with resin.

Figure 8:
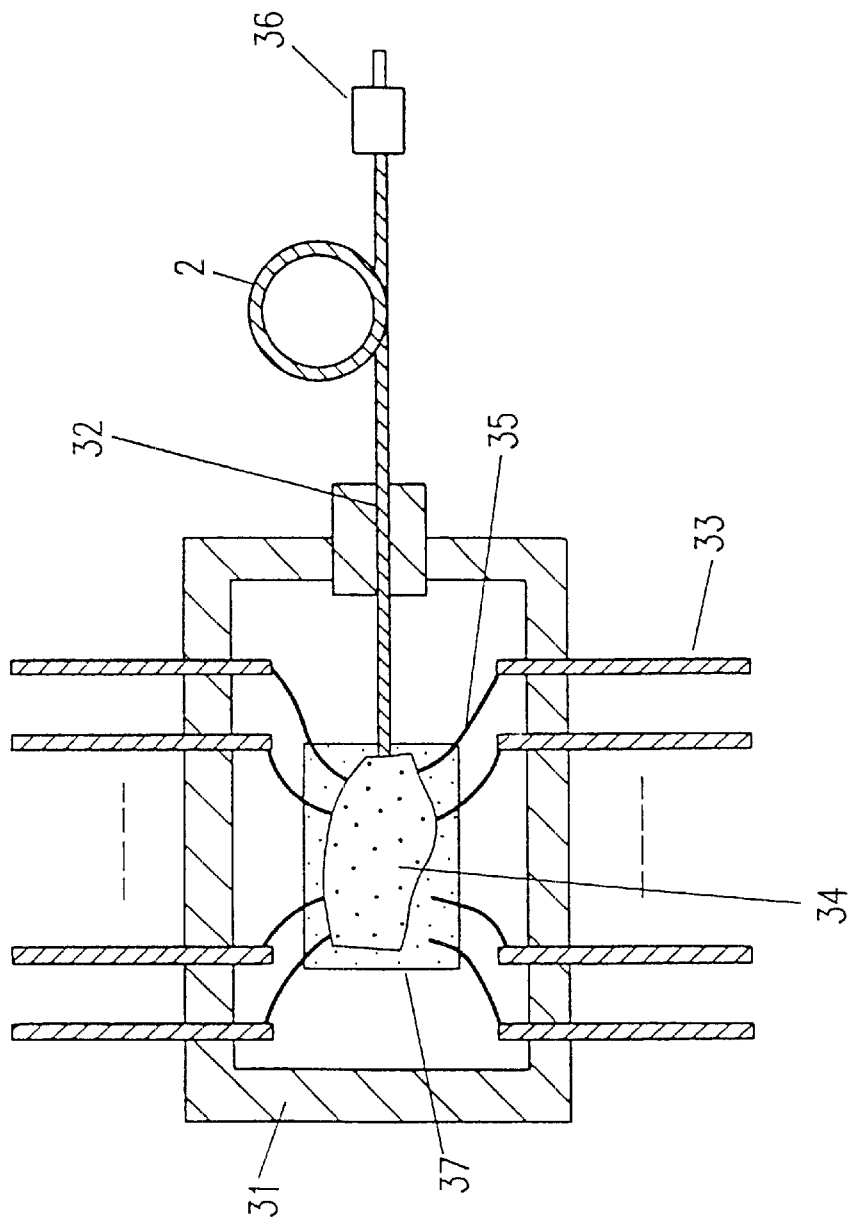
FIG. 8 is a view showing a packaged structure of the third example according to the present invention.

FIG. 8 shows a structure of the apparatus shown in FIG. 7B provided in a package. In FIG. 8, the light-receiving apparatus shown in FIG. 7B is denoted by reference numeral 37. The light-receiving apparatus 37 is fixed onto the bottom of a package 31 with conductive resin. Thereafter, one end of each electric connection terminal 33 projecting from the package 31 is connected to an electrode wiring pattern on the light-receiving apparatus 37 through an electric connection wire 35 made of aluminum. The other end of the optical fiber extending outside from the light-receiving apparatus 37 in the package 31 is connected to an optical connector 36 through an optical fiber output port 32. The surface of the light-receiving apparatus 37 is covered with protecting resin, whereby a photodetector is protected from water, gas, etc. entering the package 31 from outside. Next, an optical fiber output portion is filled with resin, whereby the inside of the package 31 is made air-tight, and the package 31 is provided with a cover portion.

When this apparatus is produced, it is not required to align each component with high precision in the direction perpendicular to the drawing surface of FIG. 8. Each component should be aligned in a plane parallel to the drawing surface. Thus, this apparatus can be easily produced by using an ordinary mounting apparatus used in the field of mounting of a semiconductor integrated circuit. All the components are fixed to the package 31, so that the apparatus has high reliability with respect to mechanical vibration.

EXAMPLE 4

Next, referring to FIGS. 9A and 9B, the fourth example of an optical device according to the present invention will be described. FIG. 9A is a plan view of the present example, and FIG. 9B is a cross-sectional view thereof. In the present example, a plurality of semiconductor laser devices as well as a plurality of photodetectors are placed on a ceramic substrate 41 with a concave portion. Thus, the optical device is capable of transmitting/receiving signal light, irrespective of its compact structure.

Hereinafter, the structure of the optical device will be described in detail.

The upper surface of the ceramic substrate 41 is divided into a first region where the semiconductor laser devices are placed and a second region where the photodetectors are placed. The first region corresponds to the bottom surface of a concave portion 43 formed on the ceramic substrate 41. As shown in FIG. 9B, there is a step between the first region and the second region, and the height of the first region is prescribed to be lower by, for example, about 60 to 70 $\mu$m than that of the second region. The reason why the concave portion is formed on the upper surface of the substrate is to mount light-emitting devices such as semiconductor laser devices on the concave portion. Since the position of a light-emitting portion of the light-emitting device is aligned with the optical axis of an optical fiber, the relative height of the bottom surface of the concave portion is adjusted.

Three grooves are formed in the second region on the upper surface of the ceramic substrate 41, and an optical fiber 48 is embedded in each groove. One parallel groove is formed so as to diagonally traverse these three optical fibers 48. One light reflective element 42 which reflects light with a wavelength of 1.55 $\mu$m and passes light with a wavelength of 1.31 $\mu$m is inserted in the parallel groove. These structures are basically the same as those in the previous examples. Therefore, the detailed description thereof will be omitted.

A semiconductor laser array 44 emitting laser light with a wavelength of 1.31 $\mu$m is placed on the first region on the upper surface of the ceramic substrate 41. In the present example, the semiconductor laser array 44 formed on the identical semiconductor substrate is used. In place of this, three different kinds of semiconductor laser devices may be arranged on separate ceramic substrates 41.

Three semiconductor photodetectors 45 are arranged in parallel on the second region on the upper surface of the ceramic substrate 41. The semiconductor photodetectors 45 are respectively placed right above the corresponding optical fibers 48 and fixed thereto with resin. Each semiconductor photodetector 45 receives a light signal with a wavelength of 1.55 $\mu$m reflected by the reflective element 42.

Electrodes 47 for a laser device are formed on the first region on the upper surface of the ceramic substrate 41, and electrodes 46 for a photodetector are formed on the second region.

Each end portion of the optical fiber 48 is provided with a lens 49 by grinding the end portion of the optical fiber 48 so that the end portion has a predetermined curvature. The lens 49 allows the signal light emitted by the semiconductor laser array 44 to be efficiently incident upon the corresponding optical fiber 48.

Hereinafter, a method for producing the abovementioned optical device will be described.

First, a concave portion is formed on a part of a ceramic substrate 41. Thereafter, electrodes 46 for a photodetector and electrodes 47 for a laser device are formed on the substrate 41 by the same method as that for forming the above-mentioned electrode wiring pattern. The electrodes 47 for a laser device are formed on the bottom surface of the concave portion of the substrate 41.

Thereafter, three V-grooves are formed on the ceramic substrate 41 by the above-mentioned method. Then, an optical fiber is embedded in each V-groove and fixed therein with resin. Then, one parallel groove is formed so as to diagonally traverse these three optical fibers. One light reflective element 42 is inserted into the parallel groove and fixed therein with resin.

Thereafter, semiconductor photodetectors 45 and a semiconductor laser array 44 are mounted at predetermined positions on the ceramic substrate 41, using resin or a solder material. At this time, the positions of the semiconductor photodetectors 45 and the semiconductor laser array 44 are respectively adjusted with respect to the electrodes 46 and 47 which have already been formed.

The semiconductor laser device array 44 is placed in such a manner that a lens 49 formed on each end of the optical fiber 48 faces the corresponding laser light-emitting portion of the semiconductor laser device array 44. Because of this, laser light beams in an array can be coupled to each of the optical fibers in an array at a time. Furthermore, if the length of a portion of the lens 49 projecting to the concave portion is made larger, a portion of the optical fiber exposed to the concave portion becomes longer. Therefore, it becomes easier to adjust the position of the lens 49 with respect to a light-emitting region of the semiconductor laser device array 44 due to the elasticity of the optical fiber 48. Therefore, it is possible to adjust the optical coupling degree of light emitted by the semiconductor laser with respect to the optical fiber 48 through the lens 49 by moving a movable portion of the optical fiber 49. If the movable portion is fixed after such an adjustment, the optical coupling efficiency can be optimized, and a larger light output can be obtained.

The above-mentioned optical device allows light signals with a wavelength of 1.55 $\mu$m transmitted in parallel through the optical fiber array composed of a plurality of optical fibers to be separately received by the semiconductor photodetector array, and simultaneously, the device is capable of sending out a light signal with a wavelength of 1.31 $\lambda$m. Thus, a plurality of bidirectional light signal transmissions are made possible in one device. Furthermore, if the electric circuits as described above, which perform the respective signal processings for the light-emitting device array and the photodetector array, are provided on one substrate, a miniaturized and cost-effective optical device can be obtained more easily.

EXAMPLE 5

Next, referring to FIGS. 10A and 10B, the fifth example of the present invention will be described. FIG. 10A is a plan view of the present example, and FIG. 10B is a cross-sectional view thereof. In the present example, photodetectors and semiconductor laser devices are placed on a glass substrate 51 with a concave portion.

Hereinafter, the structure of the optical device of the present example will be described in detail.

The upper surface of the glass substrate 51 is divided into a first region where semiconductor laser devices are formed and a second region where photodetectors are formed. The first region corresponds to the bottom surface of a concave portion 54 formed on the glass substrate 51. As shown in FIG. 10B, there is a step between the first region and the second region. The height of the first region is prescribed to be lower by, for example, about 60 to 70 $\mu$m than that of the second region.

One groove is formed on the second region on the upper surface of the glass substrate 51, and an optical fiber 52 whose end portion is changed to a multi-mode fiber 53 is embedded in the groove. The single mode fiber 52 has a core diameter of 10 $\mu$m, and the multi-mode fiber 53 has a core diameter of 50 $\mu$m. At the connecting portion between the fibers, the core diameter gradually and continuously changes from 10 $\mu$m to 50 m. Such a structure can be obtained by heat-treating the connecting portion while pulling the optical fiber toward both ends.

One parallel groove (not shown) is formed so as to diagonally traverse the optical fiber 52. One reflective element (not shown) which reflects light with a wavelength of 1.55 $\mu$m and passes light with a wavelength of 1.31 $\mu$m is inserted in the parallel groove.

Semiconductor laser devices 56 which emit laser light with a wavelength of 1.31 $\mu$m are placed on the first region on the upper surface of the substrate 51. Semiconductor photodetectors (not shown) are arranged on the second region on the upper surface of the glass substrate 51 and receive a light signal with a wavelength of 1.55 $\mu$m reflected by the reflective element.

Electrodes 58 for a laser device are formed on the first region on the upper surface of the glass substrate 51.

The semiconductor laser device 56 is previously placed on a ceramic substrate 55 together with a lens 57, using a solder material having a melting point of 230°. The characteristics of the semiconductor laser device 56 are tested by allowing a current to flow from the electrode 58, whereby only semiconductor laser devices having satisfactory characteristics are selected. The semiconductor laser devices 56 having unsatisfactory characteristics are removed in this stage, so that they are not required to be connected to optical fibers, resulting in the decrease in cost.

The ceramic substrate 55 on which the semiconductor laser device 56 is placed is connected to the concave portion 54 on the glass substrate 51 using a solder material having a melting point of 180°. Laser light emitted by the semiconductor laser device 56 is enlarged to a spot size of about 50 $\mu$m by the lens 57. Because of this, the laser light is coupled to the multi-mode optical fiber 53 with a positional precision of several $\mu$m, whereby a high coupling efficiency can be obtained. The laser light coupled to the multi-mode fiber 53 is connected to the single mode fiber 52, with its core diameter being gradually and continuously changed. Therefore, a light power can be transmitted almost completely without causing a light loss such as scattering. The low mounting precision of an optical fiber coupling system also contributes to the decrease in cost of the optical device.

EXAMPLE 6

Next, referring to FIGS. 11A and 11B, the sixth example of the present invention will be described. In FIGS. 11A and 11B, reference numeral 61 denotes a glass substrate, reference numeral 62 denotes a single mode fiber, reference numeral 63 denotes a multi-mode fiber, reference numeral 64 denotes a reflective element having a reflectance of 50% with respect to a light signal with a wavelength of 1.31 $\mu$m, reference numeral 65 denotes a semiconductor photodetector, and reference numeral 66 denotes a reflective element which passes signal light with a wavelength of 1.31 $\mu$m and reflects signal light with a wavelength of 1.55 $\mu$m.

Signal light with a wavelength of 1.55 $\mu$m transmitted from the single mode optical fiber 62 is reflected by the reflective element 66 and taken in the multi-mode fiber 63. A semiconductor photodetector is connected to the other end of the multi-mode fiber 63 so as to receive all the multi-mode light power, whereby a high quality analog signal can be received even in a multi-mode. In the case where the multi-mode light power in the multimode fiber is not always received, modal noise occurs, making it impossible to receive an analog signal satisfactorily. Signal light with a wavelength of 1.31 $\mu$m transmitted from the single mode optical fiber 62 is reflected by the reflective element 64 and received by the semiconductor photodetector 65.

EXAMPLE 7

Next, referring to FIGS. 12A and 12B, the seventh example of the present invention will be described. FIG. 12A is a perspective view of a light-receiving/light-emitting apparatus, and FIG. 12B is a cross-sectional view thereof.

In FIGS. 12A and 12B, reference numeral 71 denotes a glass substrate, reference numeral 72 denotes a single mode fiber, reference numeral 73 denotes a reflective element which passes signal light with a wavelength of 1.31 $\mu$m and reflects signal light with a wavelength of 1.55 $\mu$m, reference numeral 74 denotes a reflective element having a reflectance of 50% with respect to a light signal with a wavelength of 1.31 $\mu$m, reference numeral 75 denotes a semiconductor photodetector which receives signal light with a wavelength of 1.55 $\mu$m, reference numeral 76 denotes a semiconductor photodetector which receives signal light with a wavelength of 1.31 $\mu$m, reference numeral 77 denotes a semiconductor laser emitting light with a wavelength of 1.31 $\mu$m connected to an optical fiber 72 outside a substrate, and reference numeral 78 denotes a lens provided at a fiber end portion so as to have a predetermined curvature.

Signal light with a wavelength of 1.55 $\mu$m is reflected by the reflective element 73 and taken in the semiconductor photodetector 75. Signal light with a wavelength of 1.31 $\mu$m is reflected by the reflective element 74 and received by the semiconductor photodetector 76. Laser light emitted by the semiconductor laser 77 is coupled to a lens-shaped fiber 78, and 50% of the laser light is passed through the light reflective element 74, whereby a light signal can be transmitted bidirectionally. The semiconductor laser device 77 should be formed on a substrate which is separate from but similar to the glass substrate 71. The semiconductor laser device 77 may be accommodated in a separate housing.

EXAMPLE 8

Next, the eighth example of the present invention will be described with reference to FIG. 13.

Figure 13:
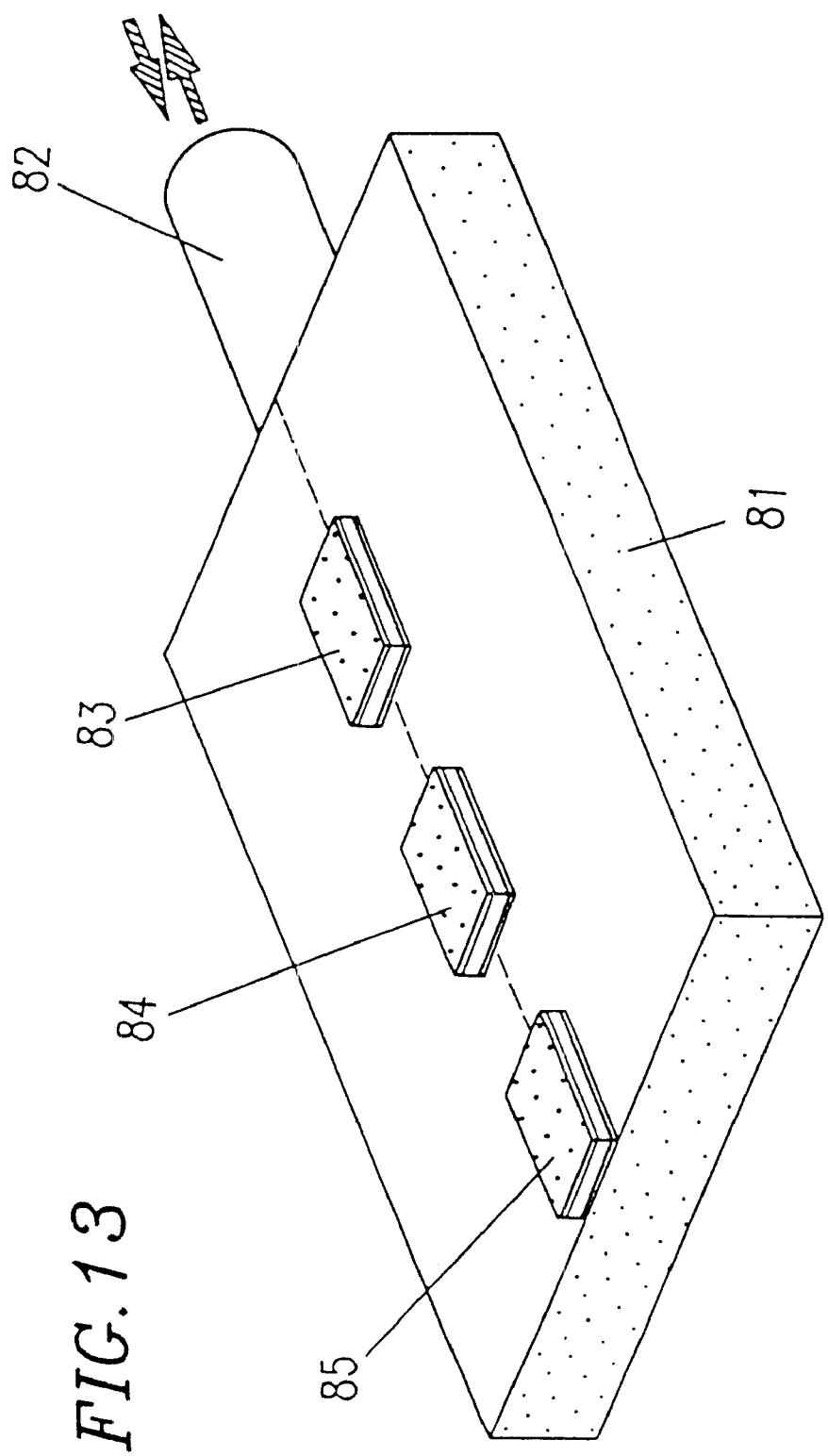
FIG. 13 is a perspective view of the eighth example of an optical device according to the present invention.

In FIG. 13, reference numeral 81 denotes a silicon semiconductor substrate, reference numeral 82 denotes a single mode optical fiber, reference numeral 83 denotes a semiconductor photodetector which receives signal light with a wavelength of 1.55 $\mu$m, reference numeral 84 denotes a semiconductor light-emitting device which emits signal light with a wavelength of 1.31 $\mu$m, and reference numeral 85 denotes a semiconductor laser emitting light with a wavelength of 1.31 $\mu$m. In FIG. 13, light reflective elements (not shown) are placed so as to diagonally traverse the optical fiber 82. The optical fiber 82 is coupled to the photodetectors 83 and 84 and the light-emitting device 85 through the light reflective elements. Herein, the light-emitting device 85 is a surface emitting laser, which is placed on the upper surface of the silicon substrate 81 together with the photodetectors 83 and 84.

The above-mentioned optical device can be produced by the same mounting method as that used for constructing an ordinary semiconductor integrated circuit. Because of its simple construction, the device can be produced at low cost and miniaturized with outstanding reliability.

In the above-mentioned examples, optical devices which utilize signal light with a wavelength of 1.55 µm and signal light with a wavelength of 1.31 µm have been mainly described. However, other combinations of wavelengths may be used. Furthermore, it is appreciated that there is no limit to materials for the components shown in the examples.

EXAMPLE 9

Figure 14:
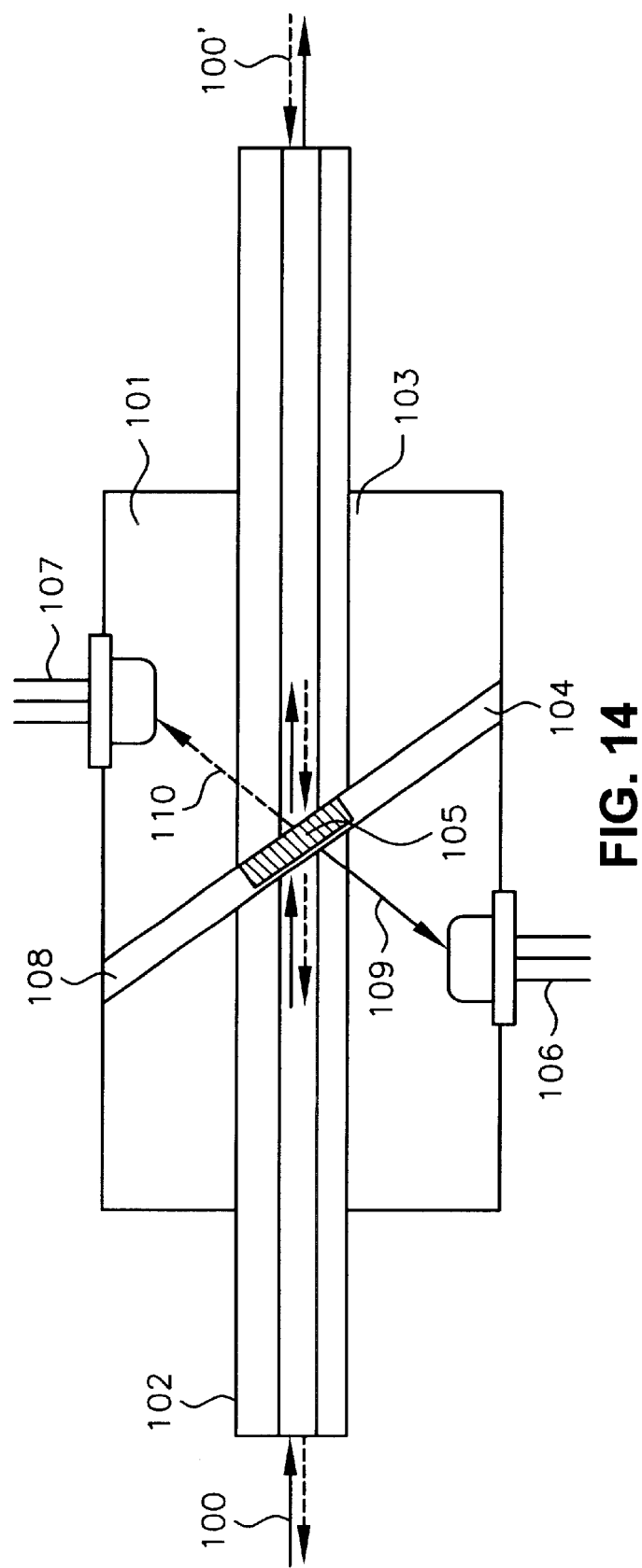
FIG. 14 is a plan view of the ninth example of an optical device according to the present invention.

Hereinafter, the ninth example of the present invention will be described with reference to FIG. 14. FIG. 14 is a plan view of the present example.

A first groove (depth: 300 µm) 103 is formed on the upper surface of a glass substrate 101 having flat upper and bottom surfaces and side surfaces perpendicular to the upper surface. The glass substrate 101 is made of a material which is substantially transparent to light with a wavelength of 1.55 µm. A single mode optical fiber (diameter: 200 µm) 102 covered with a transparent coating made of UV resin is fixed in the groove 103 with resin.

A second groove (groove width: about 100 µm) 104 is formed in the glass substrate 101 in such a manner that the second groove 104 forms a predetermined angle (60°) with respect to an optical axis of the optical fiber 102 and is perpendicular to the upper surface of the substrate 101. A light reflective element (thickness: about 80 µm) 105 having filter characteristics is inserted in the second groove 104 and fixed therein with resin 108. The resin 108 is made of an epoxy type material which is transparent to light with a wavelength of 1.55 µm, and its refractive index is almost equal to that of the optical fiber. The light reflective element 105 is designed so as to selectively reflect only signal light with a wavelength of 1.55 µm by 10%. Such a light reflective element 105 is obtained, for example, by alternately forming a silicon oxide film and a titanium oxide film on a quartz substrate. In the figure, light signals with a wavelength of 1.55 µm which bidirectionally propagate through the optical fiber are denoted by reference numerals 100 and 100', respectively.

Among the side surfaces of the substrate 101 parallel to the optical axis of the optical fiber 102, a first InGaAs semiconductor photodetector 106 is attached to one of the side surfaces, and a second InGaAs semiconductor photodetector 107 is attached to the other side surface.

A part of the light signal 100 propagating from the left side of the figure is reflected by the reflective element 105 and incident upon the first semiconductor photodetector 106 as first reflected light 109. The remaining part of the light signal 100 is passed through the reflective element 105 and propagates in the right direction through the optical fiber 102. On the other hand, a part of the light signal 100' propagating from the right side of the figure is reflected by the reflective element 105 and incident upon the second semiconductor photodetector 107 as second reflected light 110. The remaining part of the light signal 100' is passed through the reflective element 105 and propagates in the left direction through the optical fiber 102.

The optical device of the present example is inserted in the transmission path of the optical fiber, whereby the light signals 100 and 100' are transmitted bidirectionally through the optical fiber 102.

Each surface of the semiconductor photodetectors 106 and 107 is previously provided with a low reflectance coating so that a light signal is not reflected by the surface of a semiconductor layer, and a part of the light signal with a wavelength of 1.55 µm propagating through the optical fiber 102 is taken in the semiconductor photodetectors 106 and 107. Since the semiconductor photodetectors 106 and 107 used herein utilize an InP semiconductor crystal substrate which is transparent to a light signal with a wavelength of 1.55 µm, the light signal may be incident upon a crystal growth layer side or a crystal substrate side.

In the light-receiving apparatus, the transmission loss at the optical fiber portion can be made as small as 2.0 dB. Furthermore, the distance between the output point of a light signal of the optical fiber 102 and the light-receiving portion of the semiconductor photodetector can be set to be constant within several millimeters. Therefore, a light signal is prevented from spatially diffusing and reaching a region other than the light-receiving portion of the semiconductor photodetector to decrease a light-receiving efficiency. As a result, 80% or more of a component (reflected light 109) reflected by the reflective element 105 among a light signal with a wavelength of 1.55 µm propagating through the optical fiber 102 is taken in the semiconductor photodetector 106, whereby a high light-receiving efficiency is easily achieved. Similarly, 80% or more of a component (reflected light 110) reflected by the first reflective element 105 among a light signal with a wavelength of 1.55 µm propagating through the optical fiber 102 is taken in the semiconductor photodetector 107, whereby a high light-receiving efficiency is easily achieved.

Furthermore, unlike a conventional light-receiving optical device, there are no problems such as the degradation of a signal due to the multiple reflection effect of a light signal between a plurality of facets including a light-output facet of an optical fiber, a lens facet, a facet of a semiconductor photodetector, etc. Thus, the above-mentioned optical device can also be used for receiving light in an analog light signal transmission system which requires a high signal quality. Furthermore, all the components are fixed to the glass substrate 101, so that the characteristics are not changed due to the positional shift caused by external vibration and the changes in outside temperature, and the device has outstanding long-term reliability.

EXAMPLE 10

Next, the tenth example of the present invention will be described with reference to FIG. 15.

In the following description, the components which are the same as described above are denoted by the reference numerals identical therewith. The description thereof will be omitted.

Figure 15:
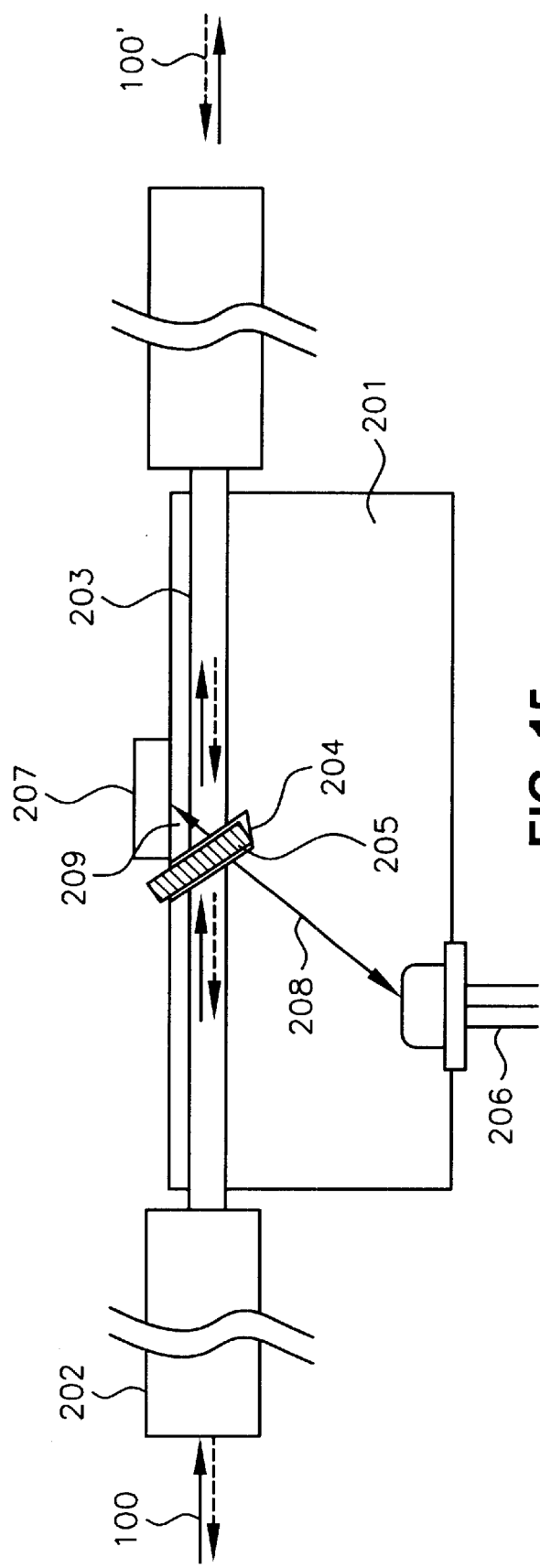
FIG. 15 is a cross-sectional view of the tenth example of an optical device according to the present invention.

As shown in FIG. 15, a first groove 203 (depth: 200 µm) having a rectangular cross-section is formed on the upper surface of a substrate 201 made of a plastic material which is transparent to light with a wavelength of 1.55 µm, in the same way as in the previous example. A single mode optical fiber (diameter: 900 µm) 202 having a coating film made of nylon resin is embedded in the first groove 203.

A second groove 204 is formed in the substrate 201 so as to be tilted with respect to the principal plane of the substrate 201. In the present example, an element 205 is tilted by 60° with respect to the optical axis of the optical fiber. The second groove 204 has a substantially rectangular cross-section and a groove width of 50 µm. A light reflective element 205 having semi-transparent and semi-reflective characteristics, in which an Au thin film is formed so as to have a thickness of 500 Å on a quartz substrate with a thickness of 30 µm, is embedded in the second groove 204 with epoxy resin.

An InGaAs semiconductor photodetector 206 with a light-receiving diameter of 300 µm is provided on the upper surface of the transparent substrate 201 by a surface mounting technique. An InGaAs semiconductor photodetector 207 with a light-receiving diameter of 300 µm sealed in a can package is provided on the bottom surface of the transparent substrate 201.

A part of a light signal 100 is reflected by the element 205 and incident upon a semiconductor photodetector 206 as reflected light 208. A part of a light signal 100' is reflected by the element 205 and incident upon a semiconductor photodetector 207 as reflected light 209.

The apparatus of the present example is inserted in the transmission path of the optical fiber, whereby the light signals 100 and 100' are transmitted bidirectionally through the optical fiber 202.

The resin embedded in the second groove 204 is selected so as to have a refractive index which does not cause a light signal taken out of the optical fiber 202 to be refracted or reflected. The surface of the semiconductor photodetector 206 is previously provided with a low reflectance coating so that a light signal is not reflected by the surface of a semiconductor layer, and a part of a light signal with a wavelength of 1.55 µm propagating through the optical fiber 202 is taken in the semiconductor photodetector 206. Since the semiconductor photodetector 207 used herein utilizes an InP semiconductor crystal substrate which is transparent to a light signal with a wavelength of 1.55 µm, the light signal may be incident upon a crystal growth layer side or a crystal substrate side. In the present example, the effect similar to that obtained in Example 9 is obtained.

EXAMPLE 11

Next, the eleventh example of the present invention will be described with reference to FIG. 16. In the following description, the components which are the same as described above are denoted by the reference numerals identical therewith. The description thereof will be omitted.

Figure 16:
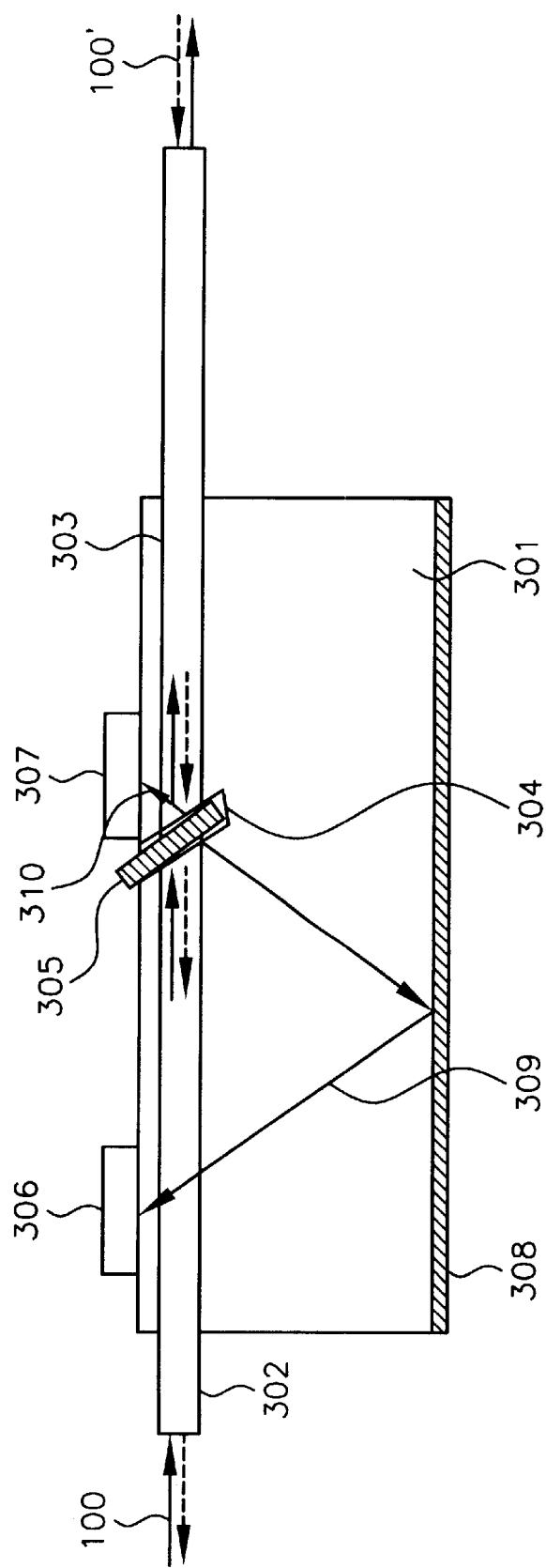
FIG. 16 is a cross-sectional view of an optical device of the eleventh example according to the present invention.

As shown in FIG. 16, a first groove 303 (depth: 200 µm) having a rectangular cross-section is formed on the upper surface of a glass substrate 301 which is substantially transparent to light with a wavelength of 1.55 µm. A single mode optical fiber (diameter: 125 µm) 302 is embedded in the first groove 303.

A second groove 304 is formed on the upper surface of the glass substrate 301 so as to be diagonal with respect to the upper surface. The second groove 304 has a substantially rectangular cross-section and a groove width of 20 µm. A light reflective element 305 (thickness: 10 µm) having filter characteristics which reflects light with a wavelength of 1.55 µm by 10% and in which a silicon oxide film and a titanium oxide film are alternately formed on a polyimide film is inserted into the second groove 304.

InGaAs semiconductor photodetectors 306 and 307 with a light-receiving diameter of 300 µm are fixed onto the glass substrate 301 by a surface mounting technique.

A reflector 308 made of an Au thin film is formed on the bottom surface of the glass substrate 301. After a part of a light signal 100 is reflected by the element 305, it is reflected by the reflector 308 and incident upon the semiconductor photodetector 306 as reflected light 309. A part of a light signal 100' is reflected by the element 305 and incident upon the semiconductor photodetector 307 as reflected light 310.

In the light-receiving optical device, the distance between a point on the element 305 where the reflected light 310 is formed and a light-receiving portion of the semiconductor photodetector 307 can be set to be constant as short as 100 to 300 µm. Therefore, a light signal is prevented from spatially diffusing and reaching a region other than the light-receiving portion of the semiconductor photodetector 307 to decrease a light-receiving efficiency. In addition, 90% or more of the reflected light 309 from the element 305 is taken in the semiconductor photodetector 307, whereby a high light-current conversion efficiency can be easily obtained. Furthermore, unlike a conventional optical device, there are no problems such as the degradation of a signal due to the multiple reflection effect of a light signal between a plurality of facets of optical elements including a light-output facet of an optical fiber, a lens facet, a facet of a semiconductor photodetector, etc. Thus, the above-mentioned optical device can also be used for receiving light in an analog light signal transmission system which requires a high signal quality. Furthermore, all the components are fixed to the glass substrate 301, so that the characteristics are not changed due to the positional shift caused by external vibration and the changes in outside temperature, and the device has outstanding long-term reliability. The arranged semiconductor photodetectors 306 and 307 may be formed on the identical semiconductor substrate.

Figure 17:
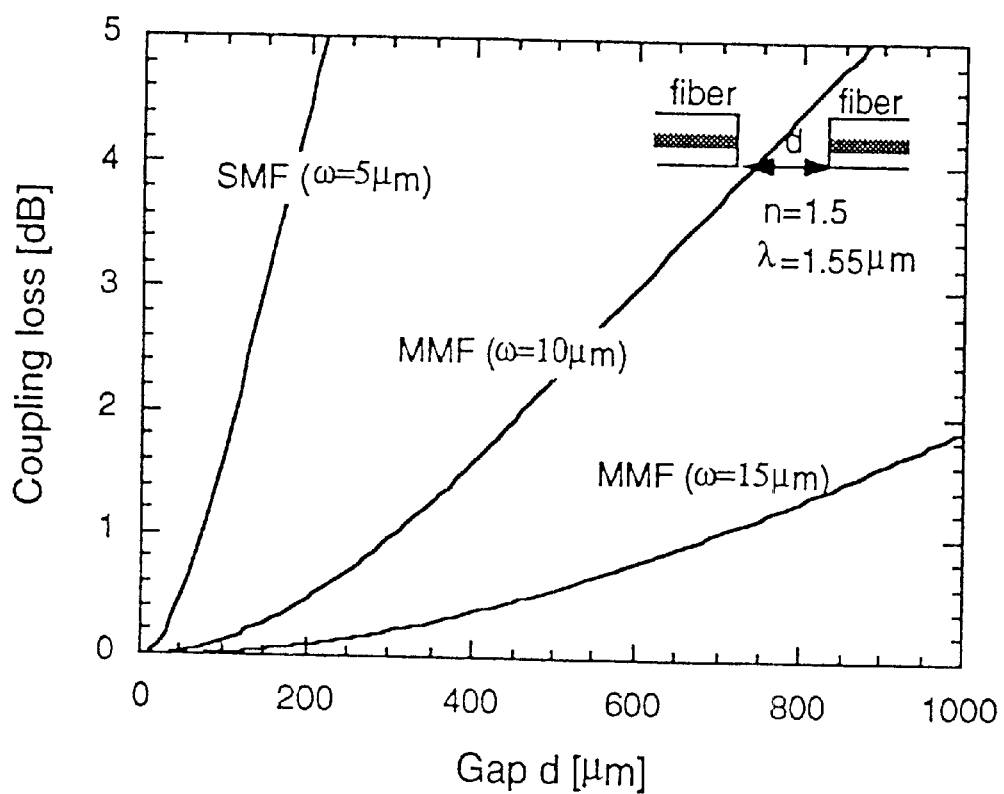
FIG. 17 is a graph showing optical coupling loss characteristics in optical fibers having different core diameters.

Next, the loss of a light signal with a wavelength of 1.55 µm which is passed through the first groove 303 formed across the optical fiber 302 will be described with reference to FIG. 17. FIG. 17 shows a calculated result and an experimental result of the light loss due to the gap of a single mode fiber (core radius ω=5 µm) which is a type generally used for optical communication.

In the case where the gap is filled with resin having a refractive index almost equal to that (n=1.5) of the optical fiber used in the present example, only a coupling loss as small as 0.2 dB occurs with respect to the gap of 20 µm. The coupling loss can be reduced firstly by decreasing the gap between fibers and secondly by increasing the core diameter of the optical fiber. FIG. 17 also shows a calculated result in the case of the core radius ω=10, ω=15 µm. It is understood that when the core radius ω increases, with the gap having the same size, the light loss is greatly reduced.

FIGS. 18A and 18B show an ordinary optical fiber 401 and an optical fiber 404 whose core diameter is partially increased, respectively.

As shown in FIG. 18A, the ordinary optical fiber 401 has a structure in which a core 402 with a predetermined diameter is covered with a clad 403. In contrast, regarding the core 402 of the optical fiber 404, if the second groove traverses a portion 405 whose diameter is larger than that of the other portion of the core 402, a signal transmission loss due to the gap of the second groove can be reduced.

In the case of producing the light-receiving optical device, it is not required to adjust the position of each component during assembly thereof, while a light signal from the optical fiber is detected. Such a light-receiving apparatus can be produced by using a mounting apparatus used in the field of a mounting technique of a silicon integrated circuit. Therefore, the apparatus is suitable for mass-production for a short period of time, and it is expected that the apparatus is produced at low cost. It is also appreciated that the apparatus can be produced by using the same method with respect to a light signal with a different wavelength.

EXAMPLE 12

Next, the twelfth example of the present invention will be described with reference to FIG. 19.

The apparatus of the present example has a structure similar to that of the apparatus shown in FIG. 14. The components identical with those in FIG. 14 are denoted by the reference numerals identical therewith, and the description thereof will be omitted.

Figure 19:
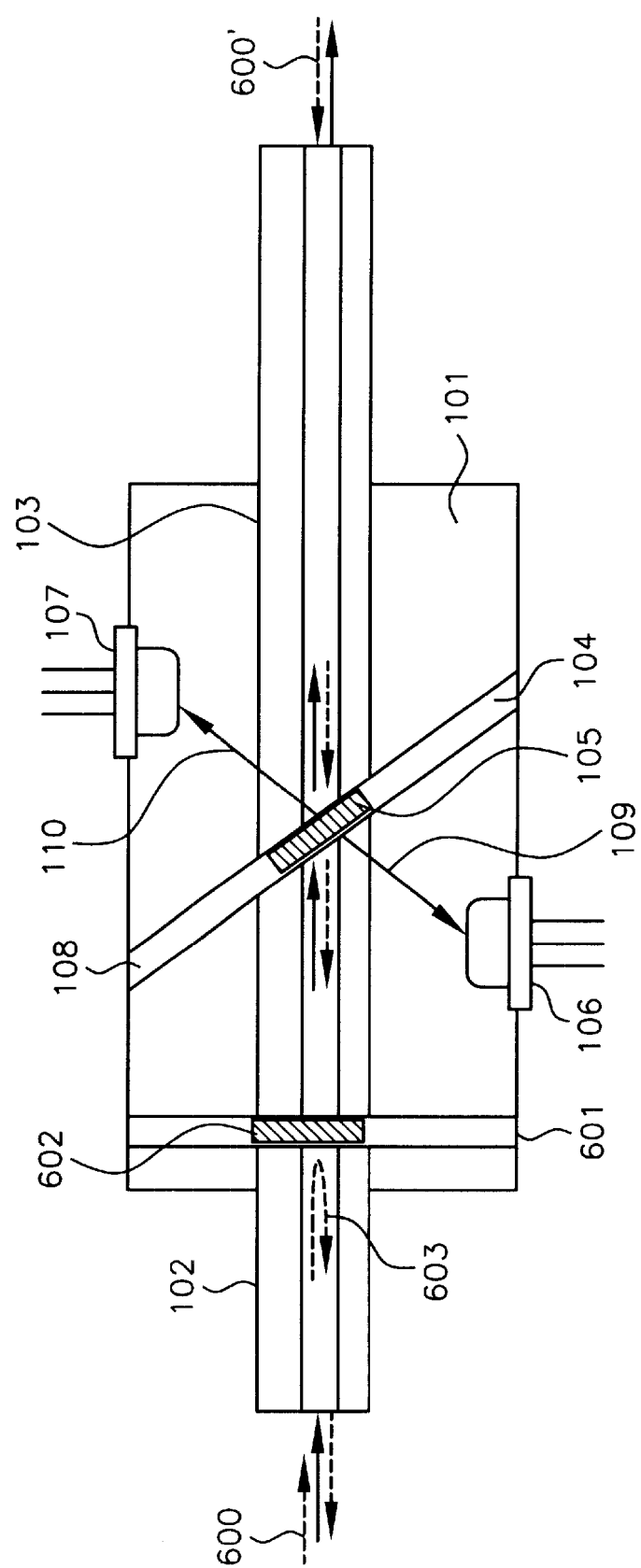
FIG. 19 is a plan view of the twelfth example of an optical device according to the present invention.

The apparatus shown in FIG. 19 is characterized in that a third groove 601 (width: 20 μm) having a substantially rectangular cross-section is formed on the principal surface of a glass substrate 101, and a second reflective element 602 which selectively reflects light with a wavelength of 1.48 μm is inserted in the third groove 601.

Because of the above-mentioned structure, in the case where a bidirectional signal 600 which contains light components with a wavelength of 1.3 μm, 1.48 μm, and 1.55 μm propagates through an optical fiber 102 from the left side of the figure, the light with a wavelength of 1.48 μm is selectively reflected by the second reflective element 602 and propagates in the left direction of the figure as reflected light 603. A bidirectional signal 600' contains light components with a wavelength of 1.3 μm and 1.55 μm.

Such an apparatus is used by being connected to an optical fiber amplifier (EDFA: Erubium Doped Fiber Amplifier) doped with erubium which is a rare-earth element. Excitation light with a wavelength of 1.48 μm is used for pumping of the optical fiber amplifier. The second element 602 prevents the excitation light from being incident upon a photodetector 106, thus reducing a noise component contained in the output of the photodetector 106. Because of this, the photodetectors 106 and 107 are capable of detecting only the light signal component with a wavelength of 1.55 μm.

In this apparatus, the photodetector 106 is used for monitoring the output of the optical fiber amplifier, and the photodetector 107 is used for monitoring reflected light returning from outside after being reflected by the optical fiber amplifier.

In the present example, resin having a refractive index almost equal to that of the optical fiber fills between the second element 602 and the side walls of the third groove. This suppresses the refraction and scattering reflection of signal light, and hence, a transmission loss hardly increases. An optical member for filtering excitation light is integrated with the glass substrate 101, so that an apparatus having high reliability with respect to mechanical vibration can be provided.

EXAMPLE 13

Next, the thirteenth example of the present invention will be described with reference to FIG. 20.

In the present example, the optical device of the example (Example 11) shown in FIG. 16 is integrated on a substrate together with an electric amplifier.

As described above, parts of optical fibers 701 and 701' are embedded in a groove of a glass substrate 301. An electric wiring pattern 703 is previously formed on the glass substrate 301, and photodetectors 306 and 307, and an electric integrated circuit element 702 having a preamplifier circuit are formed on the glass substrate 301 so as to be connected to the electric wiring pattern 703.

The glass substrate 301 is fixed onto the bottom portion of a package 705 with conductive resin. Thereafter, one end of each electric connection terminal 704 projecting from the package 705 is connected to the electric wiring pattern 703 on the glass substrate 301 through an electric connection wire made of aluminum. The optical fiber 701 extends outside from the package 705 through an optical fiber output port. Next, the optical fiber output portion is filled with resin, whereby the inside of the package 705 is made air-tight, and the package 705 is provided with a cover portion.

Figure 20:
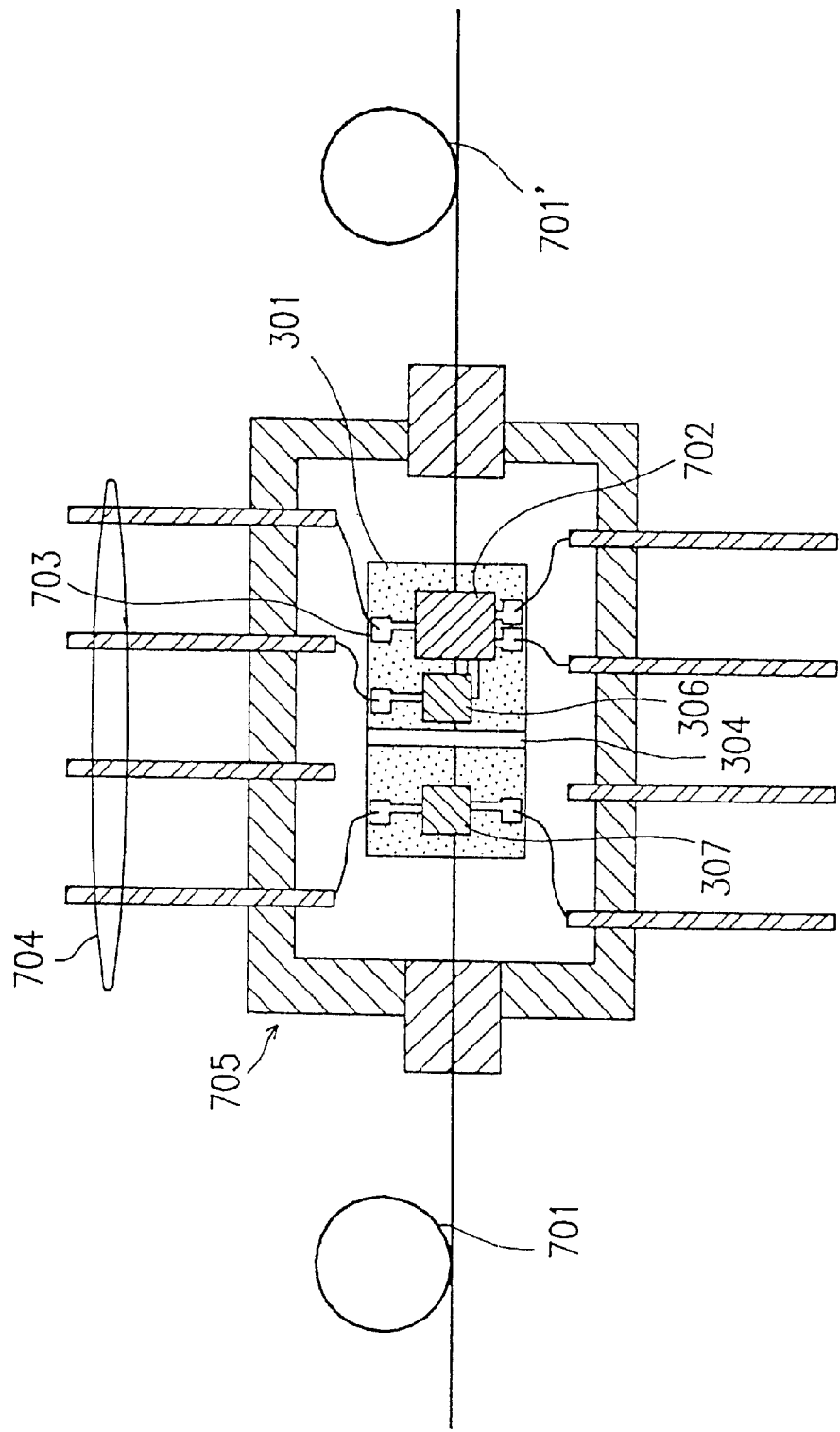
FIG. 20 is a view showing a structure of the thirteenth example of an optical device according to the present invention.

When this apparatus is produced, it is not required to align each component with high precision in the direction perpendicular to the drawing surface of FIG. 20. Each component should be aligned in a plane parallel to the drawing surface. Thus, this apparatus can be easily produced by using an ordinary mounting apparatus used in the field of mounting of a semiconductor integrated circuit. All the components are fixed to the package 705, so that the apparatus has high reliability with respect to mechanical vibration.

As described above, the present invention has the following outstanding effects: an optical device used in a system for bidirectional light transmission using an optical fiber can be miniaturized, integrated, and made light-weight; in addition, the optical device can be produced at low cost with improved productivity. Thus, the present invention has a great industrial significance.

EXAMPLE 14

Figure 21:
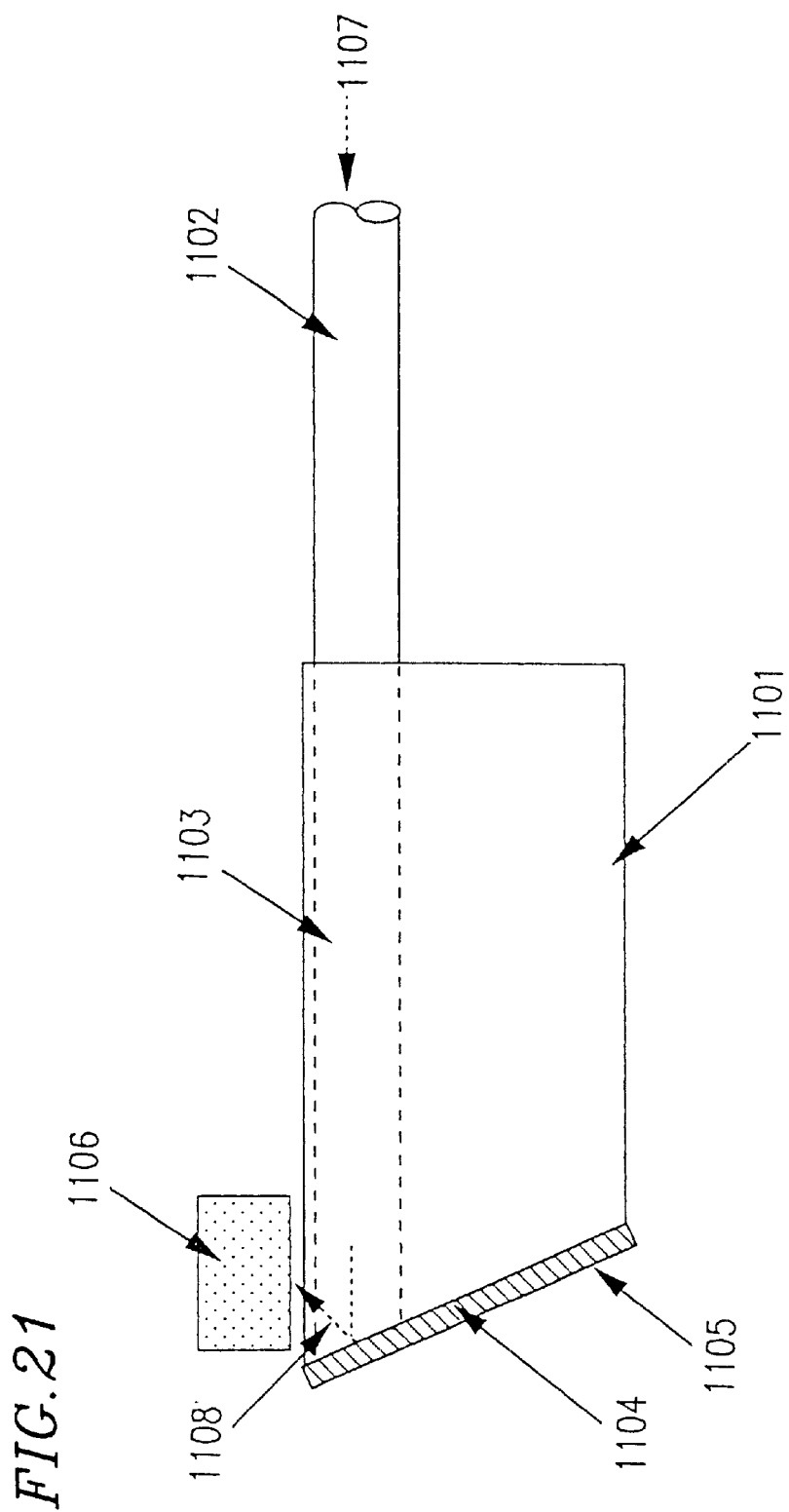
FIG. 21 is a cross-sectional view of the fourteenth example of an optical device according to the present invention.

Hereinafter, the fourteenth example of the present invention will be described with reference to FIGS. 21 and 22.

In the present example, a first groove 1103 (width: 150 μm; depth: 150 μm) having a rectangular cross-section is formed on the upper surface of a glass substrate 1101. One end portion of an optical fiber 1102 is embedded in the first groove 1103 and fixed therein with a transparent epoxy type resin material. The glass substrate 1101 is provided with a tilted facet 1104 obtained by cutting with a dicing saw. In the present example, the facet 1102 is formed in such a manner that the direction of the normal to the facet 1104 forms an angle of 30° with respect to the optical axis of the optical fiber 1102. For the reasons described later, this angle is set in the range of 5° to 40°.

A reflector 1105 is attached and fixed to the tilted facet 1104 with resin. The reflector 1105 is formed by layering titanium (Ti) and gold (Au) on a quartz substrate. An InGaAs semiconductor photodetector 1106 is provided on the upper surface of the glass substrate 1101. A light signal 1107 with a wavelength of 1.3 μm is reflected by the reflector 1105 and incident upon a semiconductor photodetector as reflected light 1108.

In the present example, the refractive index of the resin is set to be almost the same as that of the optical fiber 1102. Because of this, light signal is not scattered since physical roughness (minute unevenness) caused by cutting the facet 1104 is negligible by definition in the field of optics. The light signal is efficiently converted into an electric signal by the semiconductor photodetector 1106 placed in the reflection direction of the light signal.

In the light-receiving optical device, the distance between the output point of a light signal of the optical fiber 1102 and the light-receiving portion of the semiconductor photodetector 1106 can be set to be short (about 60 to 300 μm) at a constant value. Therefore, a light signal is prevented from spatially diffusing and reaching a region other than the light-receiving portion of the semiconductor photodetector to decrease a light-receiving efficiency. As a result, 90% or more of the light signal with a wavelength of 1.3 μm propagating through the optical fiber 1102 is taken in the semiconductor photodetector 1106, whereby a high light-receiving efficiency is easily achieved.

Figure 22:
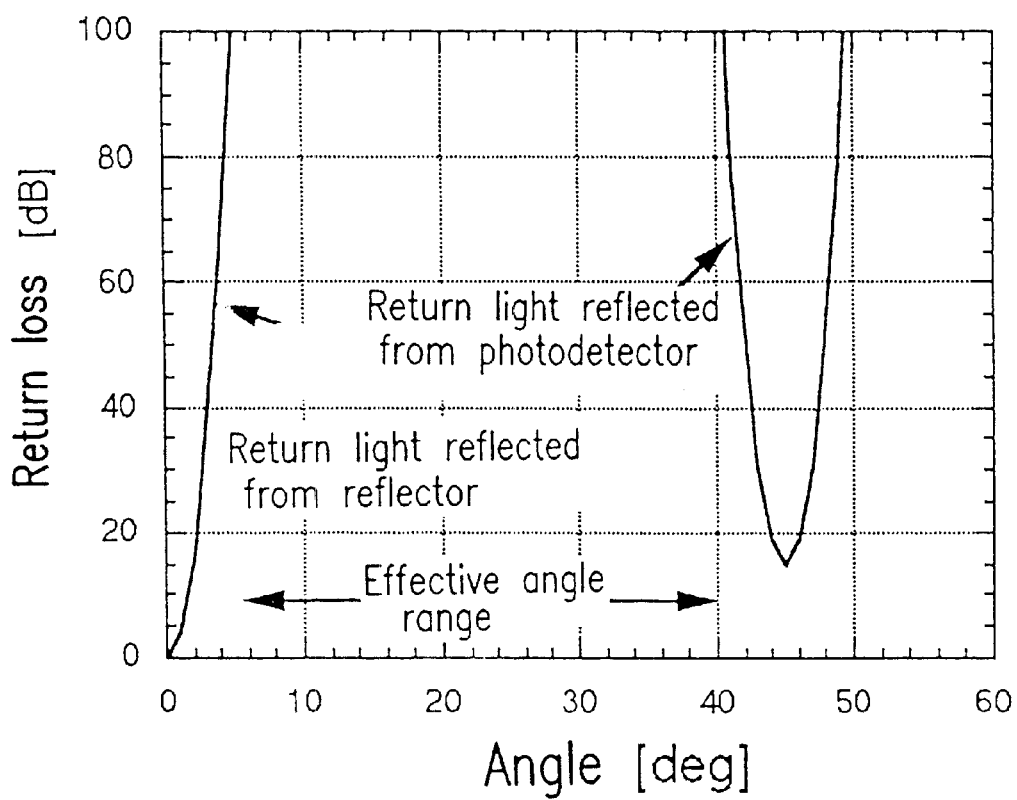
FIG. 22 is a graph showing the dependence of a return loss on an angle in the fourteen example according to the present invention.

Next, FIG. 22 shows the dependence of a return loss on a facet tilt angle. The abscissa axis of a graph of FIG. 22 represents the angle formed by the normal to the reflector 1105 and the optical axis of the optical fiber 1102, and the ordinate axis represents the return loss (optical reflectance) seen from the incident side of the optical fiber 1102.

In the case of an angle of 5° or less, the return light reflected from the surface of the reflector 1105 is fed back to the optical fiber 1102. In the case of an angle of 40° or more (the case of 45° or more is not considered in terms of a structure), the return light reflected from the surface of the semiconductor photodetector 1106 is fed back to the optical fiber 1102.

In the case where the reflected return light is large, multiple reflection occurs with respect to the reflective facet of an external optical connector, degrading the quality of the received light signal. However, according to the present invention, since the angle is set in the range of 5° to 40°, as is apparent from FIG. 22, there are no problems such as the degradation of a signal due to the multiple reflection between a plurality of optical facets including a light-output facet of an optical fiber, a facet of a lens as used in a conventional photodetector, a facet of a semiconductor photodetector, etc. Thus, the above-mentioned optical device can also be used for receiving light in an analog light signal transmission system which requires a high signal quality.

Moreover, in the embodiment of the present invention, the optical device is small because it does not use an optical component such as a lens. Furthermore, all the components are fixed to the glass substrate 1101, so that the characteristics are not changed due to the positional shift caused by external vibration and changes in outside temperature, and the device has outstanding long-term reliability.

Next, a method for producing a light-receiving apparatus will be described with reference to FIGS. 23A through 23D.

Figure 23A:
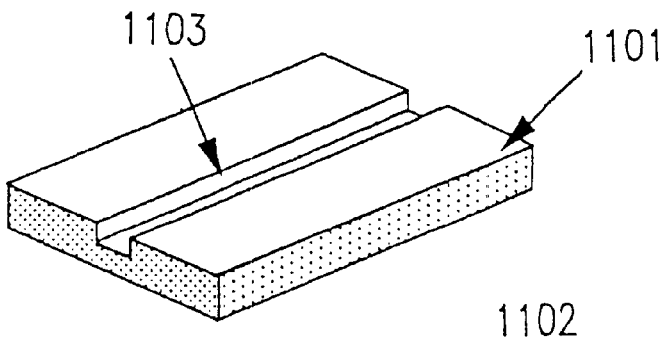
FIGS. 23A through 23D are perspective views showing a production method of the fourteenth example.

First, as shown in FIG. 23A, a first groove 1103 having a rectangular cross-section is formed on the upper surface of a glass substrate 1101 by mechanical cutting. An electrode material is previously vacuum-deposited on the upper surface of the glass substrate 1101, and a desired electrode pattern is formed by the subsequent photolithography and etching steps. During these steps, "alignment marks (not shown)" showing the position where a facet 1104 is to be provided and the position where a photodetector is to be provided are simultaneously formed on the upper surface of the glass substrate 1101.

Figure 23B:
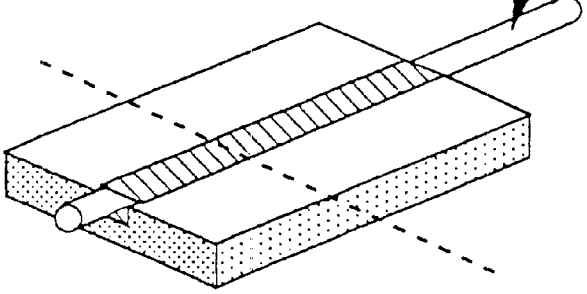

Next, as shown in FIG. 23B, an optical fiber 1102 is embedded in the first groove 1103 with a resin material. Thereafter, the resin is cured.

Figure 23C:
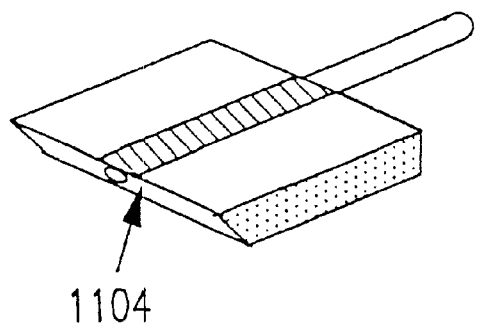

Next, a portion represented by the above-mentioned "alignment mark" on the glass substrate 1101, i.e., a portion represented by a broken line in FIG. 23B is cut by a cutting apparatus called a wire saw or a dicing saw. Thus, as shown in FIG. 23C, a substrate facet 1104 is formed at a predetermined angle with respect to the optical axis of the optical fiber 1102.

Figure 23D:
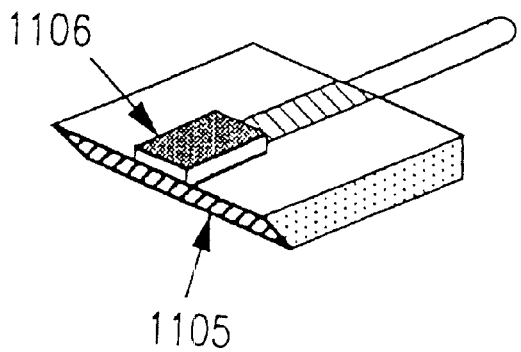

Next, as shown in FIG. 23D, a light reflective element 1105 is attached and fixed to the substrate facet 1104 with resin. A semiconductor photodetector 1106 is also placed using resin at a predetermined position represented by the alignment mark. If a resin material which is cured by external irradiation of UV light is used, the semiconductor photodetector can be fixed to the predetermined position without requiring a long curing time.

The light-receiving apparatus can be produced by using any secondary mounting means used for mounting an existing silicon integrated circuit without adjusting positions while detecting a light signal from an optical fiber. Therefore, the apparatus can be mass-produced in a short period of time at low cost.

EXAMPLE 15

Figure 24:
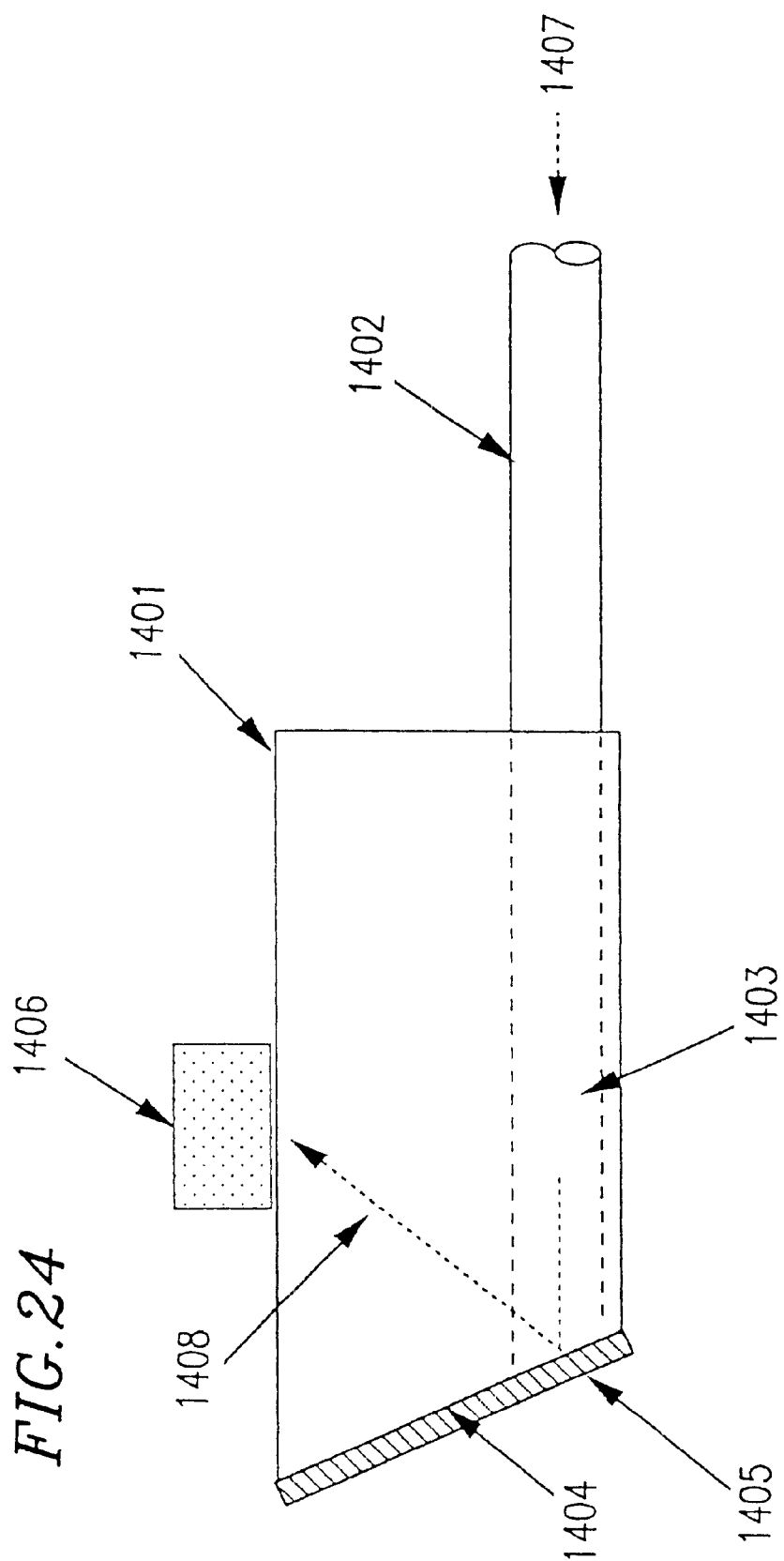
FIG. 24 is a cross-sectional view of the fifteen example of an optical device according to the present invention.

Next, the fifteenth example of the present invention will be described with reference to FIG. 24.

Reference numeral 1401 denotes a glass substrate which is transparent to a wavelength of a light signal, reference numeral 1402 denotes an optical fiber, and reference numeral 1403 denotes a first groove (width: 150 μm; depth: 150 μm) formed in the glass substrate 1401, having a rectangular cross-section, in which a part of the optical fiber 1402 is embedded and fixed with a transparent epoxy type resin material.

Reference numeral 1404 denotes a substrate facet, reference numeral 1405 denotes a reflector, reference numeral 1406 denotes a semiconductor photodetector, reference numeral 1407 denotes a light signal with a wavelength of 1.3 μm, and reference numeral 1408 denotes reflected light. They are similar to those in the example shown in FIG. 21. The light signal 1407 propagates through the optical fiber 1402, is reflected upward by the reflector 1405 attached and fixed to the substrate facet 1404, is taken out of the optical fiber 1402, reaches a light-receiving portion of the semiconductor photodetector 1406 placed on the principal plane of the substrate through the transparent glass substrate 1401, and is converted into an electric signal. In this light-receiving apparatus, outstanding characteristics as described in Example 14 can also be obtained.

EXAMPLE 16

Figure 25:
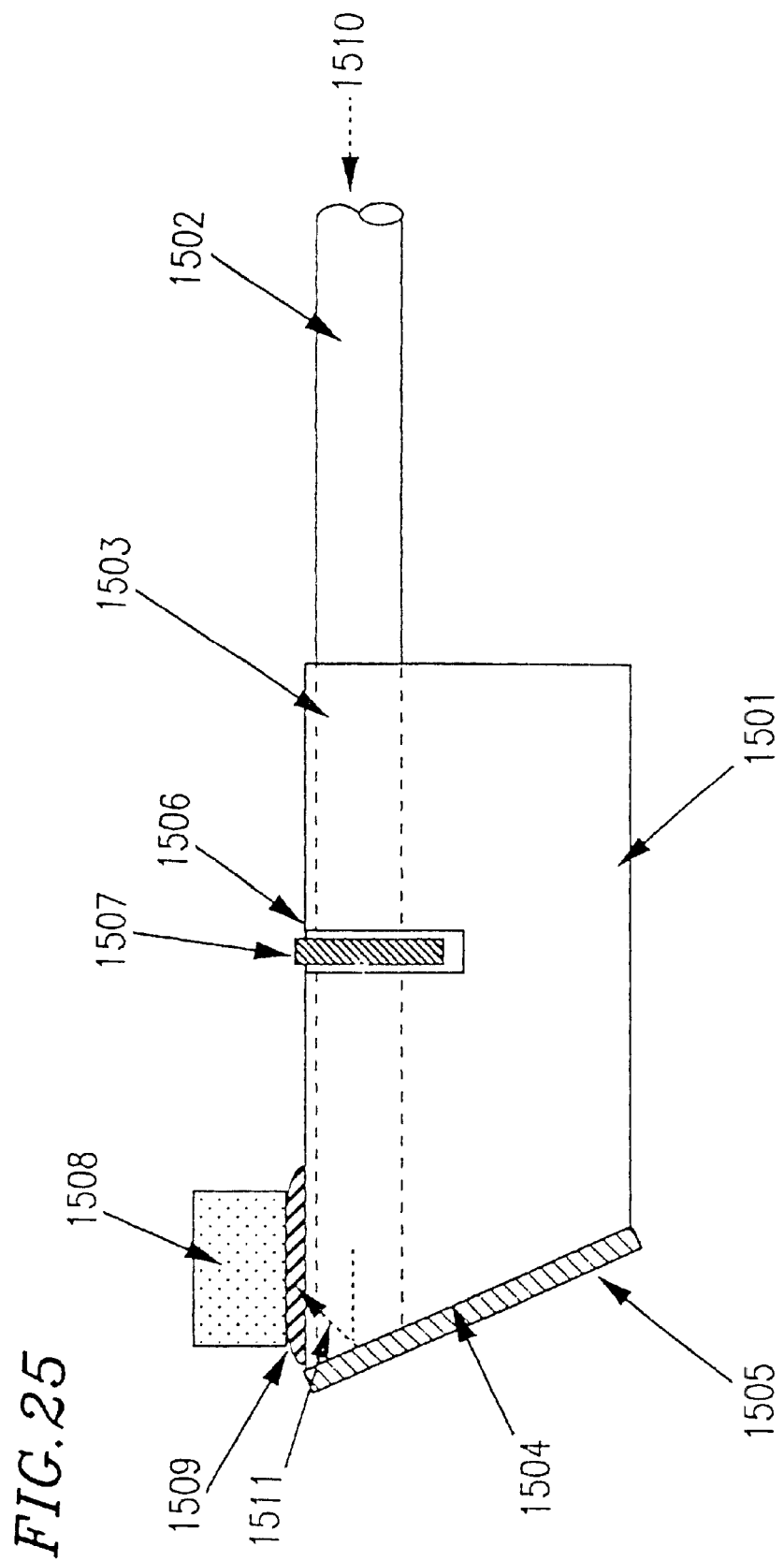
FIG. 25 is a cross-sectional view of the sixteenth example of an optical device according to the present invention.

Next, the sixteenth example of the present invention will be described with reference to FIGS. 25, 26A, and 26B. In FIG. 25, reference numeral 1501 denotes a silicon substrate, reference numeral 1502 denotes an optical fiber, reference numeral 1503 denotes a first groove with a width of 140 μm, reference numeral 1504 denotes a substrate facet, reference numeral 1505 denotes a reflector, and reference numeral 1506 denotes a slit with a width of 20 μm which is a third groove and forms a predetermined angle with respect to the optical axis of the optical fiber in the principal plane of the substrate 1501. Reference numeral 1507 denotes a filter made of a dielectric multi-layer film on a polyimide film, which passes light with a wavelength of 1.3 μm and reflects light with a wavelength of 1.55 μm, reference numeral 1508 denotes an InGaAs semiconductor photodetector, reference numeral 1509 denotes an epoxy type resin having a refractive index which is substantially the same as that of the optical fiber, reference numeral 1510 denotes a light signal containing components with a wavelength of 1.3 μm and 1.55 μm, and reference numeral 1511 denotes reflected light with a wavelength of 1.3 μm.

In the structure of the optical device of the present example, a signal component with one of two wavelengths of signal light with two wavelengths can be selectively received. It is appreciated that the number of wavelengths and the kind of the wavelength to be selected can be selected by appropriately selecting the filter 1507.

Next, the detail of a light-receiving portion of the optical device will be described with reference to FIGS. 26A and 26B.

In FIG. 26, reference numeral 1601 denotes a substrate, 1602 denotes a semiconductor photodetector, reference numeral 1603 denotes a light-receiving portion of the semiconductor photodetector 1602, reference numeral 1604 denotes electrodes for the semiconductor photodetector 1602, reference numeral 1605 denotes substrate electrodes having projecting portions made of a gold (Au) material, previously provided on the principal surface of the substrate 1601, and reference numeral 1606 denotes epoxy resin.

FIG. 26A shows the positional relationship between the semiconductor photodetector 1602 and the substrate electrodes 1605 before being fixed with resin. FIG. 26B shows the state where the semiconductor photodetector 1602 is bonded to the substrate 1601 with the epoxy resin 1606. Electrically satisfactory connection is obtained between the electrodes 1604 and the substrate electrodes 1605.

EXAMPLE 17

Next, the seventeenth example will be described with reference to FIG. 27.

Figure 27:
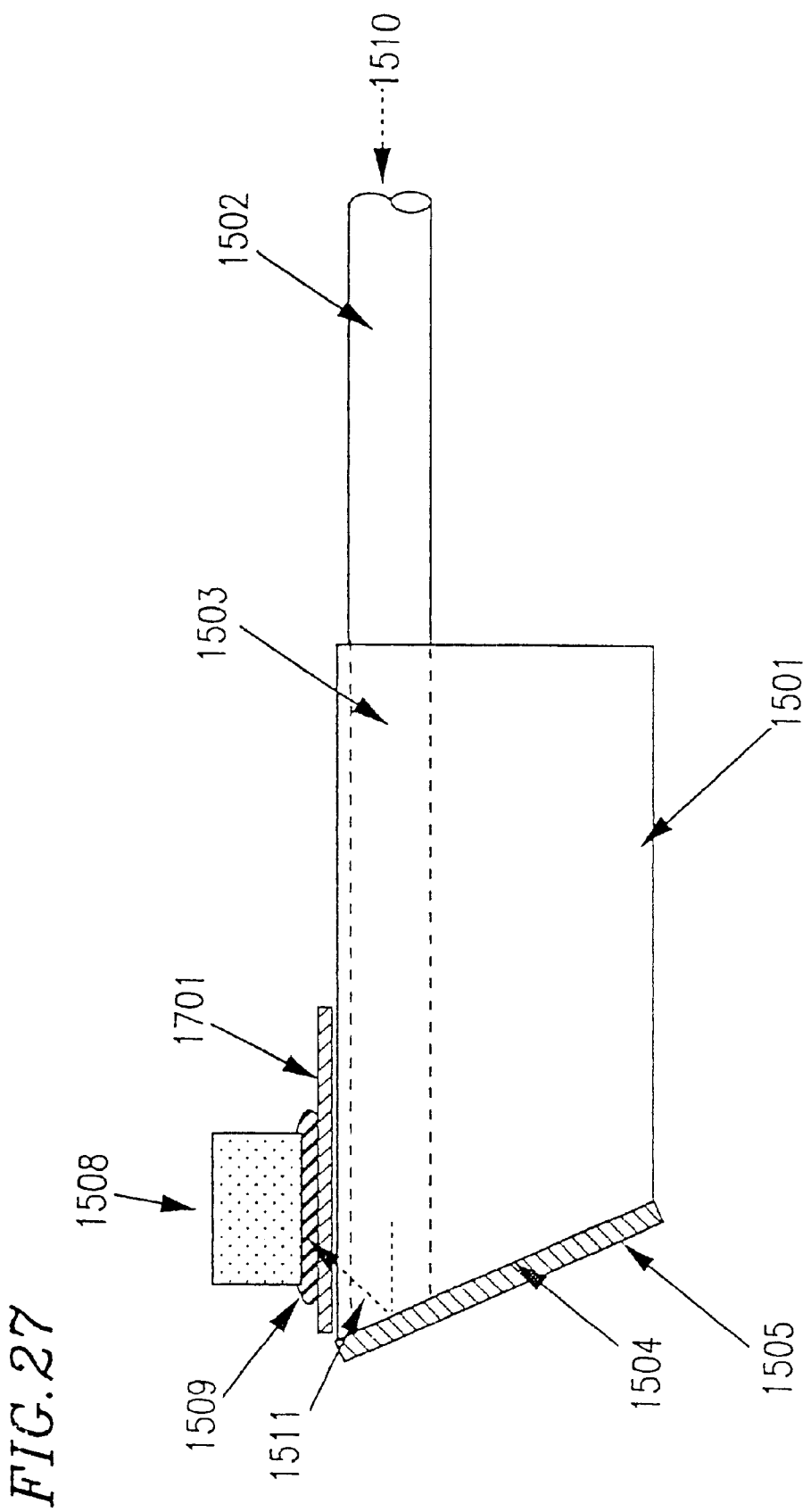
FIG. 27 is a cross-sectional view of the seventeenth example of an optical device according to the present invention.

In FIG. 27, reference numeral 1701 denotes a filter in which a dielectric multi-layer film is formed on a quartz substrate with a thickness of 40 $\mu$m and which passes light with a wavelength of 1.55 $\mu$m and reflects light with a wavelength of 1.3 $\mu$m. The components which are the same as described above are denoted by the reference numerals identical therewith. The description thereof will be omitted. Before a semiconductor photodetector 1508 is fixed onto a substrate 1501 with resin 1509, a filter 1701 is bonded onto the substrate 1501 with the same resin and placed so that reflected light 1511 is passed through the filter 1701 before reaching a light-receiving portion of the semiconductor photodetector 1508. Because of this, light-receiving characteristics having wavelength selectivity which are similar to those described in the mode for carrying out the invention are obtained. The same effect is also obtained even in the case where the filter is directly formed on the light-receiving portion of the semiconductor photodetector.

EXAMPLE 18

Figure 28:
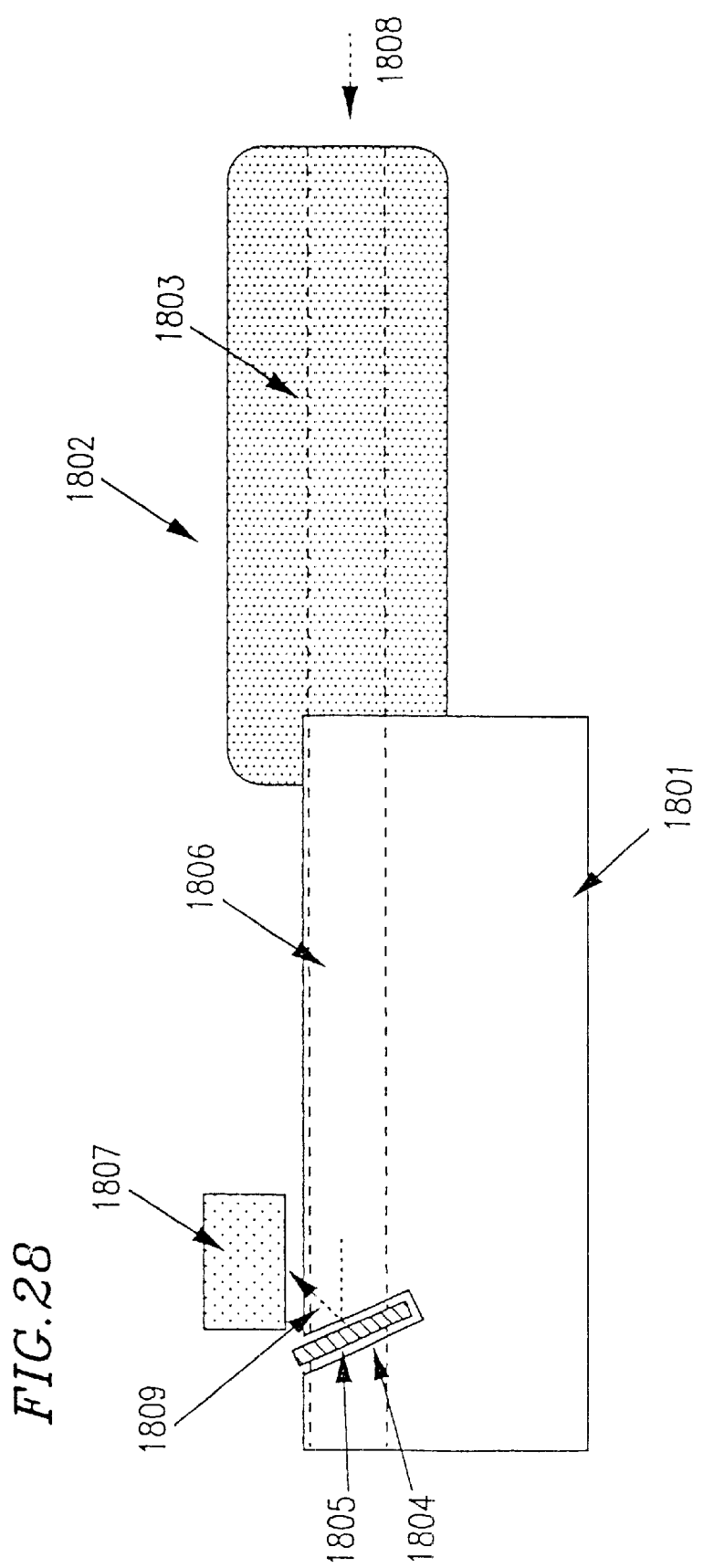
FIG. 28 is a cross-sectional view of the eighteenth example of an optical device according to the present invention.

Next, the eighteenth example of the present invention will be described with reference to FIG. 28. In FIG. 28, reference numeral 1801 denotes a substrate, reference numeral 1802 denotes a ferrule which is a component of a fiber connector, reference numeral 1803 denotes an optical fiber in the ferrule, reference numeral 1804 denotes a slit which is a second groove, reference numeral 1805 denotes a reflector, reference numeral 1806 denotes a first groove, reference numeral 1807 denotes a semiconductor photodetector, reference numeral 1808 denotes a light signal, and reference numeral 1809 denotes reflected light. The ferrule 1802 is fixed onto the substrate 1801 and connected to an external light transmission line through a fiber connector to be formed later. There is an advantage that the fiber connector is easily formed by previously connecting the ferrule 1802. Furthermore, there is an advantage that a long optical fiber is not required to be dragged during the production steps of an optical device, and its handling becomes easy. The description of the other end of the optical fiber is omitted here. If the similar ferrule is provided on the other end of the optical fiber, optical connectors are easily formed on either side of the optical fiber, whereby the connection to the external optical fiber transmission line becomes easy.

Next, a production method of the present example will be described with reference to FIGS. 29A through 29E.

Figure 29:
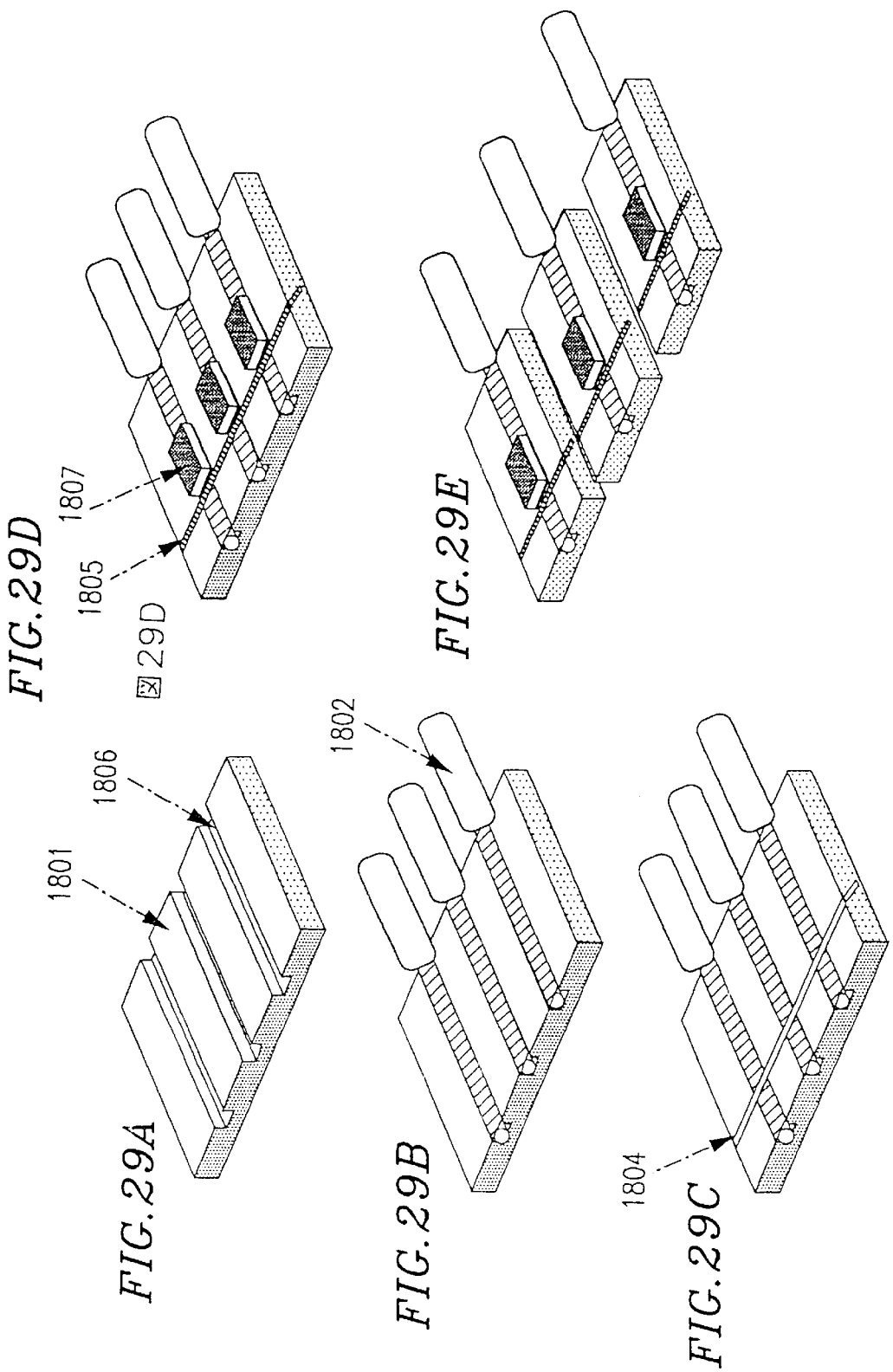
FIGS. 29A through 29E are perspective views showing a production method of the eighteenth example.
Figure 30:
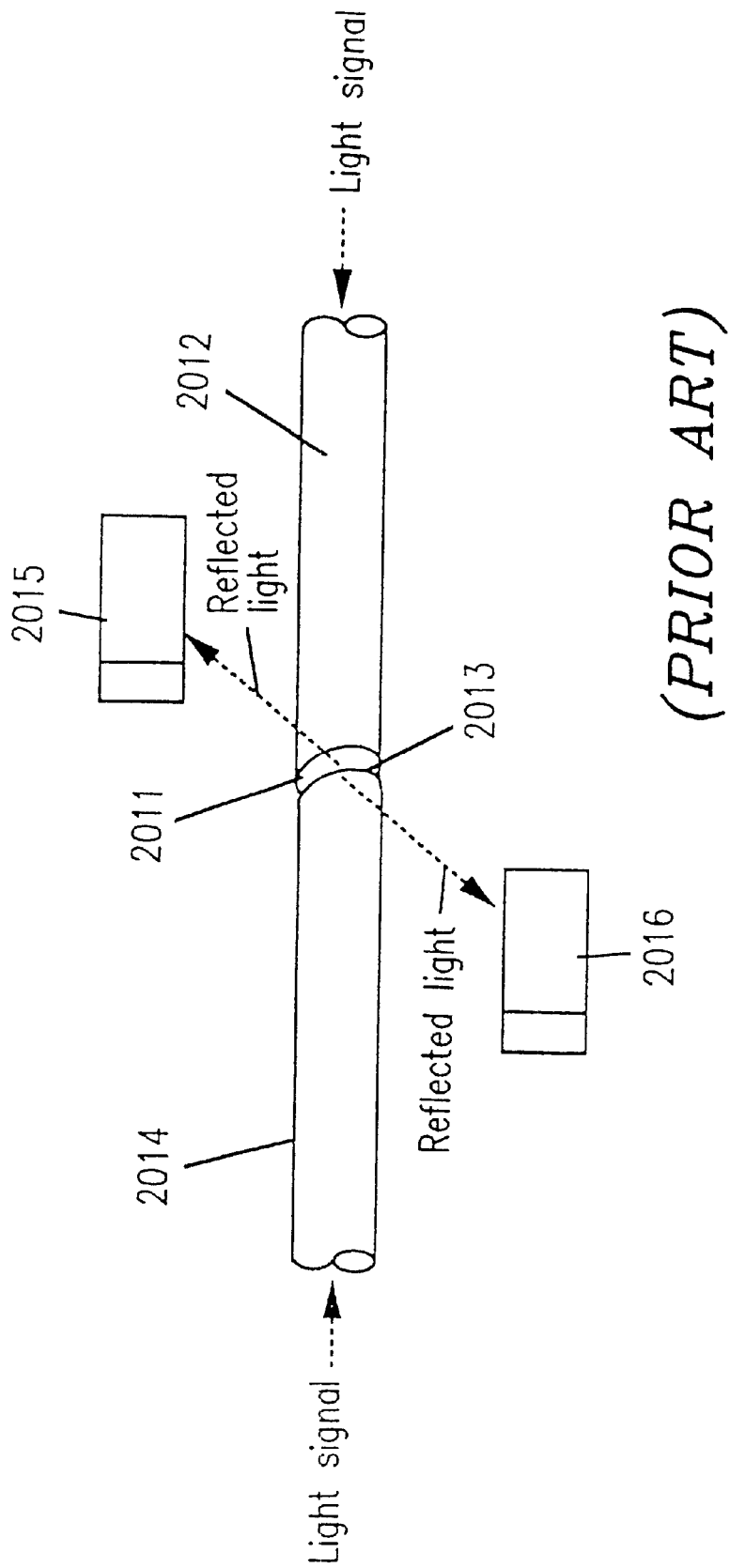
FIG. 30 is a schematic view of a conventional optical device.

As shown in FIG. 29A, a plurality of first grooves 1806 are formed in parallel with each other on the upper surface of a substrate 1801. Thereafter, as shown in FIG. 29B, a plurality of optical fibers 1803 each provided with a ferrule 1802 are embedded and fixed in the corresponding first grooves 1806 with a resin material, respectively. Next, as shown in FIG. 29C, a second groove 1804 is formed diagonally (at a predetermined angle) with respect to the upper surface of the substrate 1801 so as to traverse the optical fibers 1803.

Next, as shown in FIG. 29D, one reflective element 1805 is inserted and fixed in the second groove 1804 with a resin material. Then, each semiconductor photodetector 1807 is placed on the substrate 1801. Thereafter, as shown in FIG. 29E, the substrate 1801 is divided into each unit of optical devices.

As described above, the production method is suitable for mass-production, since the first grooves 1806 and the second groove 1804 are formed at a time with respect to a plurality of optical devices.

EXAMPLE 19

Figure 31A:
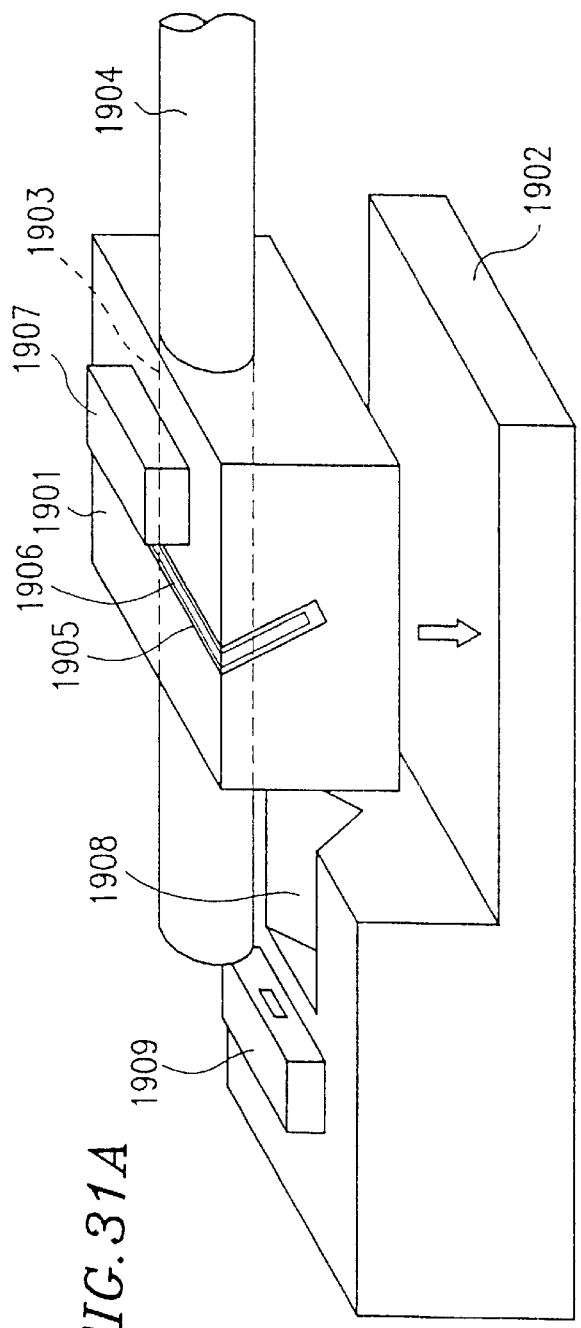
FIG. 31A is a perspective view of the nineteenth example of an optical device according to the present invention.

The nineteenth example of the present invention will be described with reference to FIGS. 31A and 31B.

In the present example, a first substrate 1901 integrated with a photodetector or the like is placed on a second substrate 1902 having difference in level on its upper surface, whereby one optical fiber module is formed. A first groove 1903 is formed in the first substrate 1901, and an optical fiber 1904 is fixed therein with resin. A second groove 1905 and a light reflective element 1906 inserted therein are formed so as diagonally traverse the optical fiber 1904. In the same way as in the previous example, the light reflective element 1906 is covered with resin in the second groove 1905, and a photodetector 1907 is fixed with resin at a position on the upper surface of the first substrate 1901 where light reflected by the light reflective element 1906 is received. The refractive indices of these resins are almost equal to that of a core portion of the optical fiber.

Figure 31B:
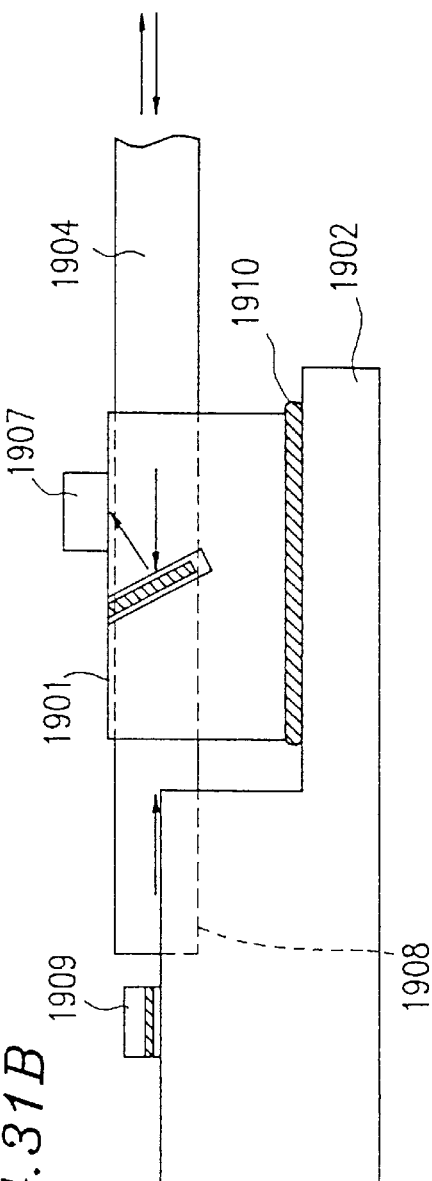
FIG. 31B is a cross-sectional view thereof.

The first substrate 1901 is bonded to the second substrate 1902, for example, with an adhesive 1910 such as silver paste, as shown in FIG. 31B. The second substrate 1902 is composed of a thick portion and a thin portion, and a V-groove 1908 is formed in the upper part of the thick portion so as to support and secure the tip end of the optical fiber 1904. The second substrate 1902 can be formed, for example, by partially etching a selected region on the upper surface of a silicon substrate.

After a semiconductor laser device 1909 is mounted on the second substrate 1902, the semiconductor laser device 1909 is subjected to a screening test in order to judge whether or not it shows predetermined satisfactory characteristics. In general, the reliability yield of the semiconductor laser device 1909 is not 100%, so that unsatisfactory semiconductor laser devices 1909 are excluded by the screening test. The screening test can be conducted before the first substrate 1901 onto which the photodetector 1907 and the optical fiber 1904 are fixed is placed on the second substrate 1902.

The height of the difference in level provided on the second substrate 1902 is adjusted in accordance with the thickness of the first substrate 1901. For example, in the case where the thickness of the first substrate 1901 is 350 $\mu$m and the depth (corresponding to the core diameter of the optical fiber 1904) of the first groove 1903 formed in the first substrate 1901 is 70 $\mu$m, the height of the difference in level of the second substrate 1902 is set in the range of about 270 to 290 $\mu$m. Thus, as shown in FIG. 31B, the position of the optical axis of the optical fiber can be aligned with the light-emitting position of the semiconductor laser device. As described in the previous example, an electrode wiring pattern (not shown) is formed on the substrates 1901 and 1902.

According to such an optical fiber module, signal light from the semiconductor laser device 1909 can be efficiently incident upon the optical fiber 1904, and signal light propagating through the optical fiber 1904 can be efficiently received by the photodetectors 1907 arranged in a line. According to the present example, subscribers' household terminals can be made smaller and less expensive.

INDUSTRIAL APPLICABILITY

As described above, according to the present invention, a miniaturized and less expensive optical device with a lower light loss and high reliability, and a method for producing the same are provided. The present invention greatly contributes to the construction of various optical fiber communication systems such as a relay-transmission system, a subscriber system, and a local area transmission system; therefore, the present invention has a great industrial significance.

What is claimed is:

1. An optical device, comprising:
   a substrate having an upper surface;
   at least one first groove formed on the upper surface of the substrate;
   an optical fiber provided in the first groove; and
   at least one second groove which diagonally traverses the optical fiber and is tilted with respect to the upper surface of the substrate,
   the device further including an optical member which is inserted in the second groove and has a surface reflecting or diffracting at least a part of light propagating through the optical fiber, and
   at least one first optical element which is provided on the upper surface of the substrate and receives light reflected or diffracted by the optical member,
   wherein an active surface of the first optical element opposes the upper surface of the substrate, and
   a material having a refractive index $n_r$ almost equal to a refractive index $n_f$ of a core portion of the optical fiber is embedded at least between the optical member and the optical fiber in the second groove,
   wherein the optical fiber has a first portion which functions as a single mode fiber in a wavelength band of signal light propagating through the optical fiber, a second portion which functions as a multi-mode fiber in the wavelength band of the signal light, and a connecting portion connecting the first portion to the second portion, and a core diameter of the connecting portion gradually and continuously changes from the first portion to the second portion.

2. An optical device, comprising:
   a substrate;
   at least one first groove formed on the substrate;
   an optical fiber;
   an optical member;
   a photodetector which is fixed on the substrate via a light-transparent resin and receives light reflected by the optical member which continues in the optical fiber to travel through the light-transparent resin;
   the optical fiber provided in the first groove, the optical fiber having a substantially circular cross section in a region where the optical fiber is optically coupled with the photodetector;
   a facet of the substrate which diagonally traverses the optical fiber; and
   the optical member is attached to the facet of the substrate, the optical member having a surface which reflects or diffracts at least a part of light propagating through the optical fiber,
   wherein the light-transparent resin is embedded at least between an active surface of the photodetector and the substrate and has a refractive index $n_p$ almost equal to a refractive index $n_f$ of a core portion of the optical fiber, the photodetector is provided on a surface of the substrate on which the first groove is formed;
   a third groove which traverses the optical fiber; and
   a second optical member inserted in the third groove, which reflects light in a specified wavelength region,
   wherein the second optical member prevents the light in the specified wavelength region propagating through the optical fiber from being incident upon the photodetector.

3. An optical device, comprising:
   a substrate;
   at least one first groove formed on the substrate;
   an optical fiber;
   an optical member;
   a photodetector which is fixed on the substrate via a light-transparent resin and receives light reflected by the optical member which continues in the optical fiber to travel through the light-transparent resin;
   the optical fiber provided in the first groove, the optical fiber having a substantially circular cross section in a region where the optical fiber is optically coupled with the photodetector;
   a facet of the substrate which diagonally traverses the optical fiber; and
   the optical member attached to the facet of the substrate, the optical member having a surface which reflects or diffracts at least a part of light propagating through the optical fiber,
   wherein the light-transparent resin is embedded at least between an active surface of the photodetector and the substrate and has a refractive index $n_p$ almost equal to a refractive index $n_f$ of a core portion of the optical fiber, the photodetector is provided on a surface of the substrate on which the first groove is formed; and
   a filter having a dielectric multi-layer film structure is formed on a light-receiving surface of the photodetector.

4. An optical device, comprising:
   a substrate;
   at least one first groove formed on the substrate;
   an optical fiber provided in the first groove;
   at least one second groove diagonally traversing the optical fiber;
   an optical member which is inserted in the second groove and has a surface reflecting or diffracting at least a part of light propagating through the optical fiber, an angle formed by a direction of a normal to the surface of the optical member and a direction of an optical axis of the optical fiber is in the range of 5° to 40°;
   a material having a refractive index $n_r$ almost equal to a refractive index $n_f$ of a core portion of the optical fiber is embedded at least between the optical member and the optical fiber in the second groove; and at least one first optical element which is fixed on the substrate via a light-transparent resin and receives light reflected or diffracted by the optical member through the light-transparent resin, wherein the light-transparent resin is embedded at least between an active surface of the first optical element and the substrate and has a refractive index $n_p$ almost equal to the refractive index $n_f$ of the core portion of the optical fiber; and wherein the optical fiber has a first portion which functions as a single mode fiber in a wavelength band of signal light propagating through the optical fiber, a second portion which functions as a multi-mode fiber in the wavelength band of the signal light, and a connecting portion connecting the first portion to the second portion, and a core diameter of the connecting portion gradually and continuously changes from the first portion to the second portion.

5. An optical device, comprising:

a substrate;

at least one first groove formed on the substrate;

an optical fiber provided in the first groove;

at least one second groove diagonally traversing the optical fiber;

an optical member which is inserted in the second groove and has a surface reflecting or diffracting at least a part of light propagating through the optical fiber, an angle formed by a direction of a normal to the surface of the optical member and a direction of an optical axis of the optical fiber is in the range of 5° to 40°;

a material having a refractive index $n_r$ almost equal to a refractive index $n_f$ of a core portion of the optical fiber is embedded at least between the optical member and the optical fiber in the second groove; and at least one first optical element which is fixed on the substrate via a light-transparent resin and receives light reflected or diffracted by the optical member through the light-transparent resin, wherein the light-transparent resin is embedded at least between an active surface of the first optical element and the substrate and has a refractive index np almost equal to the refractive index nf of the core portion of the optical fiber;

wherein the substrate has an upper surface and a bottom surface, the first optical element is provided on the upper surface of the substrate, and the device further includes at least one second optical element which is provided on the bottom surface of the substrate and receives light reflected or diffracted by the optical member; and wherein the optical fiber allows signal light to propagate bidirectionally, the first optical element receives signal light propagating in a first direction through the optical fiber, and the second optical element receives signal light propagating in a second direction opposite to the first direction through the optical fiber.

6. An optical device according to claim 5, further comprising a third groove which traverses the optical fiber and a second optical member inserted in the third groove, having a surface which reflects and removes light containing an unnecessary wavelength component propagating through the optical fiber.

7. An optical device according to claim 5, wherein the bidirectional signal light has wavelengths different from each other, the optical member has a base which is transparent and has a refractive index almost equal to a refractive index of the optical fiber and two reflective coatings formed on two principal planes of the base, and the two reflective coatings exhibit different reflection characteristics, respectively.

8. An optical device, comprising:

a substrate;

at least one first groove formed on the substrate;

an optical fiber;

an optical member;

a photodetector which is fixed on the substrate via a light-transparent resin and receives light reflected by the optical member which continues in the optical fiber to travel through the light-transparent resin;

the optical fiber provided in the first groove, the optical fiber having a substantially circular cross section in a region where the optical fiber is optically coupled with the photodetector;

a facet of the substrate which diagonally traverses the optical fiber; and the optical member attached to the facet of the substrate, the optical member having a surface which reflects or diffracts at least a part of light propagating through the optical fiber, wherein the light-transparent resin is embedded at least between an active surface of the photodetector and the substrate and has a refractive index $n_p$ almost equal to a refractive index $n_f$ of a core portion of the optical fiber;

a third groove which traverses the optical fiber; and a second optical member inserted in the third groove, which reflects light in a specified wavelength region, wherein the second optical member prevents the light in the specified wavelength region propagating through the optical fiber from being incident upon the photodetector.

9. An optical device, comprising:

a substrate;

at least one first groove formed on the substrate;

a photodetector which is fixed on the substrate via a light-transparent resin and receives light reflected by an optical member through the light-transparent resin;

an optical fiber provided in the first groove, the optical fiber having a substantially circular cross section in a region where the optical fiber is optically coupled with the photodetector;

a facet of the substrate which diagonally traverses the optical fiber; and the optical member attached to the facet of the substrate, the optical member having a surface which reflects or diffracts at least a part of light propagating through the optical fiber, wherein the light-transparent resin is embedded at least between an active surface of the photodetector and the substrate and has a refractive index $n_p$ almost equal to a refractive index $n_f$ of a core portion of the optical fiber; and a filter having a dielectric multi-layer film structure is formed on a light-receiving surface of the photodetector.

10. An optical device, comprising:

a substrate;

at least one first groove formed on the substrate;

an optical fiber provided in the first groove;

at least one second groove diagonally traversing the optical fiber;

an optical member which is inserted in the second groove and has a surface reflecting or diffracting at least a part of light propagating through the optical fiber, an angle formed by a direction of a normal to the surface of the optical member and a direction of an optical axis of the optical fiber is in the range of 5° to 40°;

a material having a refractive index $n_r$ almost equal to a refractive index $n_f$ of a core portion of the optical fiber is embedded at least between the optical member and the optical fiber in the second groove; and at least one first optical element which is fixed on the substrate via a light-transparent resin and receives light reflected or diffracted by the optical member through the light-transparent resin, wherein the light-transparent resin is embedded at least between an active surface of the first optical element and the substrate and has a refractive index $n_p$ almost equal to the refractive index $n_f$ of the core portion of the optical fiber;

wherein the substrate has an upper surface and a bottom surface on which a reflector is attached, the first optical element is provided on the upper surface of the substrate, and the optical device further includes at least one second optical element which is provided on the upper surface of the substrate and receives light reflected or diffracted by the optical member via the reflector; and wherein the optical fiber allows signal light to propagate bidirectionally, the first optical element receives signal light propagating in a first direction through the optical fiber, and the second optical element receives signal light propagating in a second direction opposite to the first direction through the optical fiber.

11. An optical device according to claim 10, further comprising a third groove which traverses the optical fiber and a second optical member inserted in the third groove, having a surface which reflects and removes light containing an unnecessary wavelength component propagating through the optical fiber.

12. An optical device according to claim 10, wherein the bidirectional signal light has wavelengths different from each other, the optical member has a base which is transparent and has a refractive index almost equal to a refractive index of the optical fiber and two reflective coatings formed on two principal planes of the base, and the two reflective coatings, exhibit different reflection characteristics, respectively.

* * * * *